(12) United States Patent
Jobetto

(10) Patent No.: US 7,972,903 B2
(45) Date of Patent: Jul. 5, 2011

(54) SEMICONDUCTOR DEVICE HAVING WIRING LINE AND MANUFACTURING METHOD THEREOF

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 186 days.

(21) Appl. No.: 12/359,427

(22) Filed: Jan. 26, 2009

(65) Prior Publication Data

US 2009/0194866 A1 Aug. 6, 2009

(30) Foreign Application Priority Data

Jan. 31, 2008 (JP) .................................. 2008-020691

(51) Int. Cl.
*H01L 21/44* (2006.01)
*H01L 21/48* (2006.01)

(52) U.S. Cl. ........ 438/108; 438/118; 438/629; 438/667; 438/127; 257/E21.596

(58) Field of Classification Search .................. 438/108, 438/629, 127, 667; 257/E21.596, E23.125
See application file for complete search history.

(56) References Cited

U.S. PATENT DOCUMENTS

| | | | | |
|---|---|---|---|---|
| 5,111,278 A | * | 5/1992 | Eichelberger | 257/698 |
| 5,353,498 A | * | 10/1994 | Fillion et al. | 29/840 |
| 5,527,741 A | * | 6/1996 | Cole et al. | 438/107 |
| 5,703,400 A | * | 12/1997 | Wojnarowski et al. | 257/723 |
| 5,821,626 A | * | 10/1998 | Ouchi et al. | 257/778 |
| 6,154,366 A | * | 11/2000 | Ma et al. | 361/704 |
| 6,271,469 B1 | * | 8/2001 | Ma et al. | 174/521 |
| 6,590,291 B2 | | 7/2003 | Akagawa | |
| 6,696,764 B2 | * | 2/2004 | Honda | 257/778 |
| 7,183,639 B2 | | 2/2007 | Mihara et al. | |
| 7,358,114 B2 | * | 4/2008 | Ooi et al. | 438/106 |
| 7,445,964 B2 | | 11/2008 | Mihara et al. | |
| 2002/0182770 A1 | * | 12/2002 | Chen et al. | 438/106 |
| 2003/0137057 A1 | * | 7/2003 | Honda | 257/778 |
| 2004/0051169 A1 | * | 3/2004 | Chen et al. | 257/684 |
| 2004/0245614 A1 | | 12/2004 | Jobetto | |
| 2009/0194885 A1 | | 8/2009 | Jobetto | |

FOREIGN PATENT DOCUMENTS

CN 1723556 A 1/2006

(Continued)

OTHER PUBLICATIONS

Related U.S. Appl. No. 12/359,449, filed Jan. 26, 2009.
Japanese Office Action dated Jan. 12, 2010 and English translation thereof issued in a counterpart Japanese Application No. 2008-020691.

(Continued)

*Primary Examiner* — Nitin Parekh
(74) *Attorney, Agent, or Firm* — Holtz, Holtz, Goodman & Chick, PC

(57) ABSTRACT

An insulating film covering the lower surface of an external connection electrode of a semiconductor construct is formed. A mask metal layer in which there is formed an opening having a planar size smaller than that of the external connection electrode is formed on the insulating film. The mask metal layer is used as a mask to apply a laser beam to the insulating film, such that a connection opening reaching the external connection electrode is formed in the insulating film. A wiring line is formed on the insulating film in such a manner as to be connected to the external connection electrode via the connection opening.

10 Claims, 32 Drawing Sheets

FOREIGN PATENT DOCUMENTS

| | | |
|---|---:|---|
| CN | 1830081 A | 9/2006 |
| JP | 9-321408 A | 12/1997 |
| JP | 2001-217337 A | 8/2001 |
| JP | 2003-017854 A | 1/2003 |
| JP | 2003-188314 A | 7/2003 |
| JP | 2004-71998 A | 3/2004 |
| JP | 2004-87661 A | 3/2004 |
| KR | 2005-16302 A | 2/2005 |
| WO | WO 2004/064153 A1 | 7/2004 |

OTHER PUBLICATIONS

Chinese Office Action dated Jan. 29, 2010 and English translation thereof in counterpart Chinese Application No. 2009100098367.

Chinese Office Action dated Feb. 26, 2010 and English translation thereof issued in Chinese Application No. 200910009626.8, which is a Chinese counterpart of related U.S. Appl. No. 12/359,449.

Korean Office Action dated Sep. 15, 2010 (and English translation thereof) in counterpart Korean Application No. 10-2009-0004927.

* cited by examiner

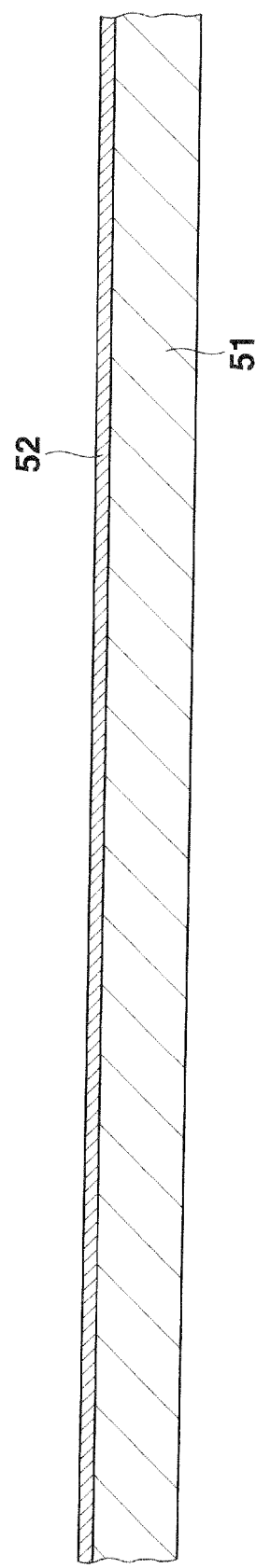

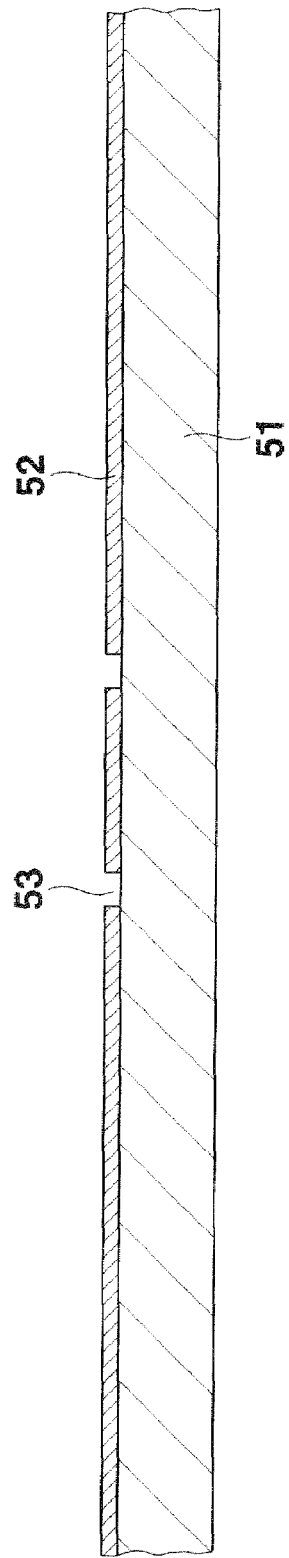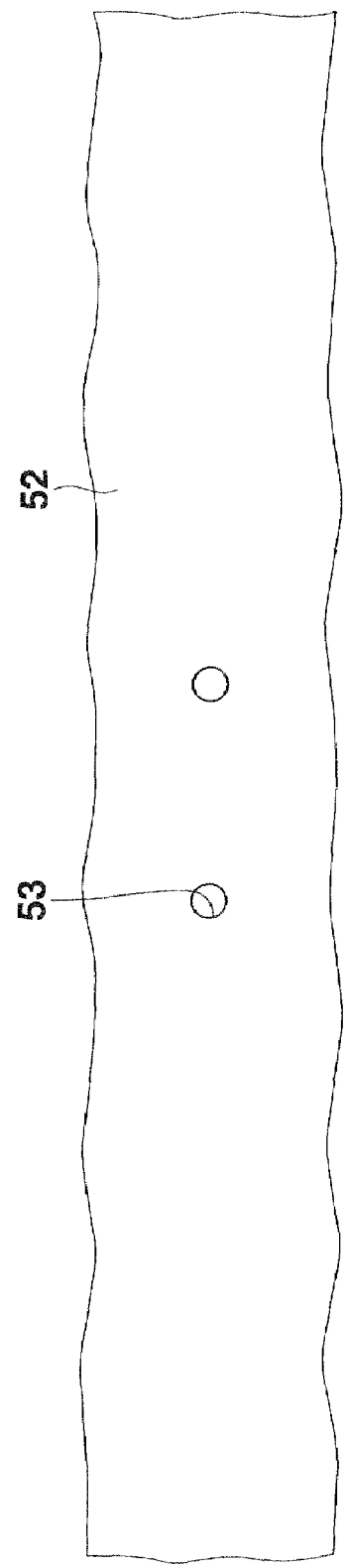

SEMICONDUCTOR DEVICE HAVING WIRING LINE AND MANUFACTURING METHOD THEREOF

CROSS-REFERENCE TO RELATED APPLICATIONS

This application is based upon and claims the benefit of priority from prior Japanese Patent Application No. 2008-020691, filed Jan. 31, 2008, the entire contents of which are incorporated herein by reference.

BACKGROUND OF THE INVENTION

1. Field of the Invention

This invention relates to a semiconductor device having a wiring line and a manufacturing method thereof.

2. Description of the Related Art

In a method employed to increase the packaging density of a semiconductor device, a semiconductor construct called a chip size package (CSP) is provided on a base plate having a planar size greater than that of semiconductor construct. Jpn. Pat. Appln. KOKAI Publication No. 2004-71998 discloses the structure of such a semiconductor device and a manufacturing method thereof. In the semiconductor device disclosed in this prior literature, an insulating layer is provided on the base plate around the semiconductor construct. An upper insulating film is provided on the semiconductor construct and the insulating layer. An upper wiring line is provided on the upper insulating film so that this upper wiring line is connected to an external connection electrode (columnar electrode) of the semiconductor construct.

In the meantime, in the conventional semiconductor device manufacturing method described above, it is necessary to form an opening in a part of the upper insulating film corresponding to the center of the upper surface of the columnar electrode of the semiconductor construct in order to connect the upper wiring line formed on the upper insulating film to the columnar electrode of the semiconductor construct. In this case, it is known to form the opening in the upper insulating film by laser processing based on laser beam irradiation.

On the other hand, if the diameter of the laser beam is about 50 μm, which is the minimum diameter at present, the diameter of the opening to be formed in the upper insulating film is about 70 μm. In this case, when the accuracy of the laser processing is taken into account, the diameter of the columnar electrode of the semiconductor construct needs to be 100 to 120 μm. Therefore, there has been a problem that the miniaturization of the semiconductor construct is limited and an increase in the number of columnar electrodes is not possible.

BRIEF SUMMARY OF THE INVENTION

It is therefore an object of this invention to provide a semiconductor device and a manufacturing method thereof that enable further miniaturization.

According to the invention, there is provided a semiconductor device comprising:

a semiconductor construct having a semiconductor substrate and an external connection electrode provided on the semiconductor substrate;

an insulating layer formed around the semiconductor construct;

an insulating film having an opening corresponding to the external connection electrode of the semiconductor construct; and a wiring line which is connected to the external connection electrode via the opening and which is extended from a region corresponding to the semiconductor substrate to a region corresponding to the insulating layer.

And there is provided an insulating film covering the lower surface of the external connection electrode of the semiconductor construct, and a mask metal layer in which an opening having a planar size smaller than that of the external connection electrode is formed to correspond to the external connection electrode. The mask metal layer is provided under the insulating film. And in the insulating film, a connection opening reaching the external connection electrode is formed by using the mask metal layer as a mask to apply a laser beam to the insulating film via the opening. And then a wiring line on the insulating film is formed so that the wiring line is connected to the external connection electrode of the semiconductor construct via the connection opening of the insulating film.

According to the invention, a semiconductor device that enable further miniaturization can be provided by using a mask metal layer with an opening formed on the insulating film as a mask to apply a laser beam so that a connection opening can be formed at one part of the insulating layer corresponding to the external connection electrode of the semiconductor construct.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a sectional view of an initially prepared unit in one example of a method of manufacturing the semiconductor device shown in FIG. 1;

FIG. 3A is a sectional view of a step following FIG. 2, and FIG. 3B is a plan view thereof;

DETAILED DESCRIPTION OF THE INVENTION

First Embodiment

Figure 1:
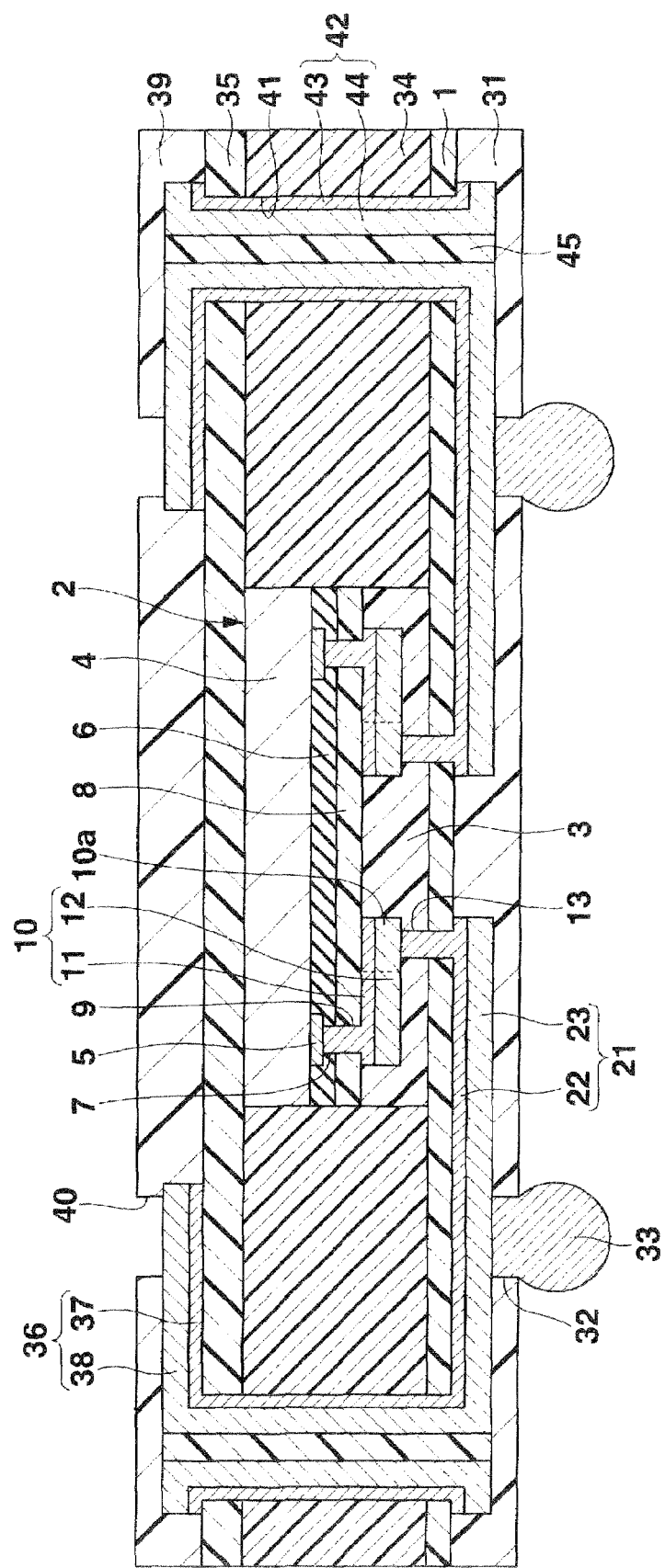
FIG. 1 is a sectional view of a semiconductor device as a first embodiment of this invention.

FIG. 1 shows a sectional view of a semiconductor device as a first embodiment of this invention. This semiconductor device comprises a planar square lower insulating film 1 made of, for example, an epoxy resin, a polyimide resin, or an epoxy resin having a glass cloth base material. A semiconductor construct 2 is installed at the center of the upper surface of the lower insulating film 1 via an adhesive layer 3 made of, for example, an epoxy resin.

The semiconductor construct 2 comprises a planar square silicon substrate (semiconductor substrate) 4. An integrated circuit (not shown) having a predetermined function is provided on the lower surface of the silicon substrate 4. In the peripheral parts of this lower surface, a plurality of connection pads 5 made of, for example, an aluminum-based metal and connected to the integrated circuit are provided along the sides of the silicon substrate. An insulating film 6 made of, for example, silicon oxide is provided on the lower surface of the silicon substrate 4 except for the centers of the connection pads 5, and the centers of the connection pads 5 are exposed via openings 7 provided in the insulating film 6.

A protective film 8 made of, for example, a polyimide resin is provided on the lower surface of the insulating film 6. Openings 9 are provided in parts of the protective film 8 corresponding to the openings 7 of the insulating film 6. Wiring lines (wiring members) 10 are provided on the lower surface of the protective film 8. The wiring line 10 has a double-layer structure composed of a foundation metal layer 11 made of nickel and provided on the lower surface of the protective film 8, and an upper metal layer 12 made of copper and provided on the lower surface of the foundation metal layer 11. One end of the wiring line 10 is connected to the connection pad 5 via the openings 7, 9 in the insulating film 6 and the protective film 8. Although only two wiring lines 10 are shown in the drawing, the number of wiring lines 10 actually provided corresponds to the connection pads 5 arranged along the respective sides of the planar square silicon substrate 4. Other ends of the wiring lines 10 which are referred to as connection pad portions (external connection electrodes) 10a described later are arranged in a matrix form under the insulating film 6.

Furthermore, the lower surface of the protective film 8 including the wiring lines 10 of the semiconductor construct 2 is adhesively bonded to the center of the upper surface of the lower insulating film 1 via the adhesive layer 3 made of, for example, an epoxy resin, such that the semiconductor construct 2 is installed at the center of the upper surface of the lower insulating film 1. Openings (connection openings) 13 having a circular planar shape are provided in the parts of the lower insulating film 1 and the adhesive layer (insulating film) 3 corresponding to the centers of the lower surfaces of the connection pad portions (external connection electrodes) 10a of the wiring lines 10 of the semiconductor construct 2.

A lower wiring line 21 is provided on the lower surface of the lower insulating film 1. The lower wiring line 21 has a double-layer structure composed of a foundation metal layer 22 made of nickel and provided on the lower surface of the lower insulating film 1, and an upper metal layer 23 made of copper and provided on the lower surface of the foundation metal layer 22. One end of the lower wiring line 21 is connected to the connection pad portion 10a of the wiring line 10 of the semiconductor construct 2 via an opening 13 in the lower insulating film 1 and the adhesive layer 3.

A lower overcoat film 31 made of, for example, a solder resist is provided on the lower surfaces of the lower wiring line 21 and the lower insulating film 1. An opening 32 is provided in a part of the lower overcoat film 31 corresponding to the connection pad portion of the lower wiring line 21. A solder ball 33 is provided in and under the opening 32 of the lower overcoat film 31 so that this solder ball is connected to the connection pad portion of the lower wiring line 21.

An insulating layer 34 is provided on the upper surface of the lower insulating film 1 around the semiconductor construct 2 and the adhesive layer 3. The insulating layer 34 is made of, for example, an epoxy resin, a polyimide resin, or an epoxy resin having a glass cloth base material. An upper insulating film 35 made of the same material as the lower insulating film 1 is provided on the upper surfaces of the semiconductor construct 2 and the insulating layer 34.

An upper wiring line 36 is provided on the upper surface of the upper insulating film 35. The upper wiring line 36 has a double-layer structure composed of a foundation metal layer 37 made of nickel and provided on the upper surface of the upper insulating film 35, and an upper metal layer 38 made of copper and provided on the upper surface of the foundation metal layer 37. An upper overcoat film 39 made of, for example, a solder resist is provided on the upper surfaces of the upper wiring line 36 and the upper insulating film 35. An opening 40 is provided in a part of the upper overcoat film 39 corresponding to the connection pad portion of the upper wiring line 36.

The lower wiring line 21 and the upper wiring line 36 are connected to each other via a vertical conducting portion 42 provided within a through-hole 41 which is provided in the lower insulating film 1, the insulating layer 34 and the upper insulating film 35. The vertical conducting portion 42 has a double-layer structure composed of a foundation metal layer 43 made of nickel and provided on the inner peripheral surface of the through-hole 41, and an upper metal layer 44 made of copper and provided on the inner surface of the foundation metal layer 43. A filling material 45 made of, for example, a solder resist is filled in the vertical conducting portion 42.

Next, one example of a method of manufacturing this semiconductor device is described. First, as shown in FIG. 2, a unit is prepared wherein a mask metal layer 52 made of electroless nickel plating is formed on the upper surface of a base plate 51 made of copper foil. In this case, this prepared unit is sized so that a plurality of completed semiconductor devices shown in FIG. 1 can be formed. The mask metal layer 52 is intended for the formation of a mask used when laser processing is carried out by applying a laser beam, described later.

Figure 4:
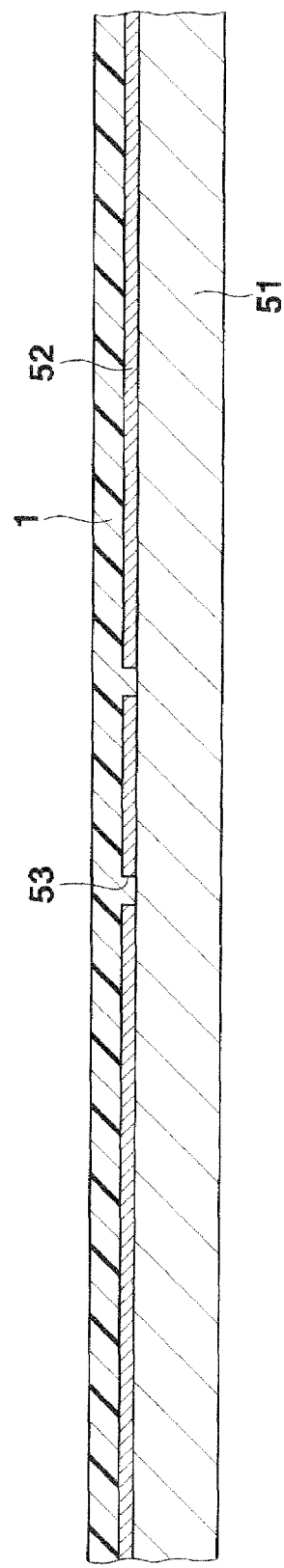
FIG. 4 is a sectional view of a step following FIG. 3.

Then, as shown in FIG. 3A and in FIG. 3B which is a plan view FIG. 3A, an opening 53 having a circular planar shape is formed by a photolithographic method at a predetermined point of the mask metal layer 52 (a part corresponding to the center of the lower surface of the connection pad portion 10a of the wiring line 10 of the semiconductor construct 2 shown in FIG. 1). Further, as shown in FIG. 4, the lower insulating film 1 made of, for example, an epoxy resin, a polyimide resin, or an epoxy resin having a glass cloth base material is formed on the upper surface of the mask metal layer 52 including the inside of the openings 53.

Figure 5:
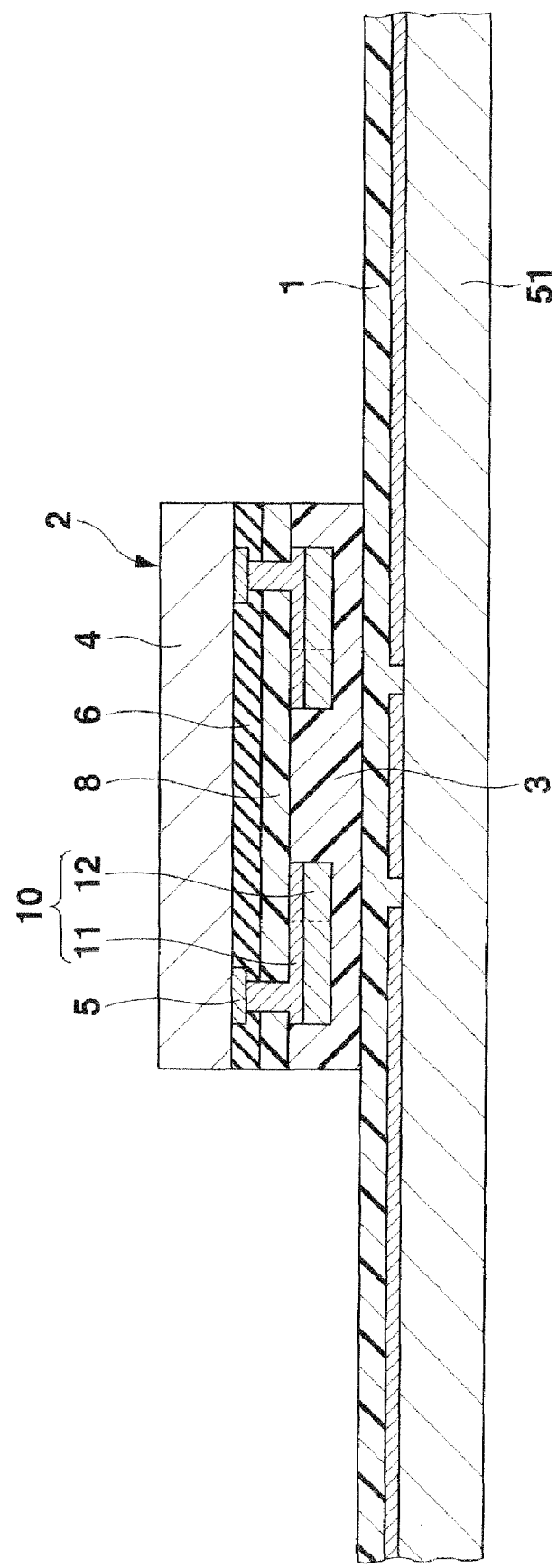
FIG. 5 is a sectional view of a step following FIG. 4.

Then, as shown in FIG. 5, the semiconductor construct 2 is prepared. In order to obtain this semiconductor construct 2, the integrated circuit (not shown), the connection pads 5 made of, for example, an aluminum-based metal, the insulating film 6 made of, for example, silicon oxide, the protective film 8 made of, for example, a polyimide resin and the wiring line 10 (the foundation metal layer 11 made of nickel and the upper metal layer 12 made of copper) are formed under the silicon substrate 4 in a wafer state and then divided into pieces by dicing.

Then, the lower surface of the protective film 8 including the wiring lines 10 of the semiconductor construct 2 is adhesively bonded to a semiconductor construct installation region on the upper surface of the lower insulating film 1 via the adhesive layer 3 made of, for example, an epoxy resin, such that the semiconductor construct 2 is installed thereon. In this case, the semiconductor construct installation region on the upper surface of the lower insulating film 1 is previously supplied with an adhesive called a non-conductive paste (NCP) using, for example, a printing method or a dispenser or supplied with an adhesive sheet called a non-conductive film (NCF), and the semiconductor construct 2 is fixedly connected onto the upper surface of the lower insulating film 1 by hot press bonding.

Figure 6:
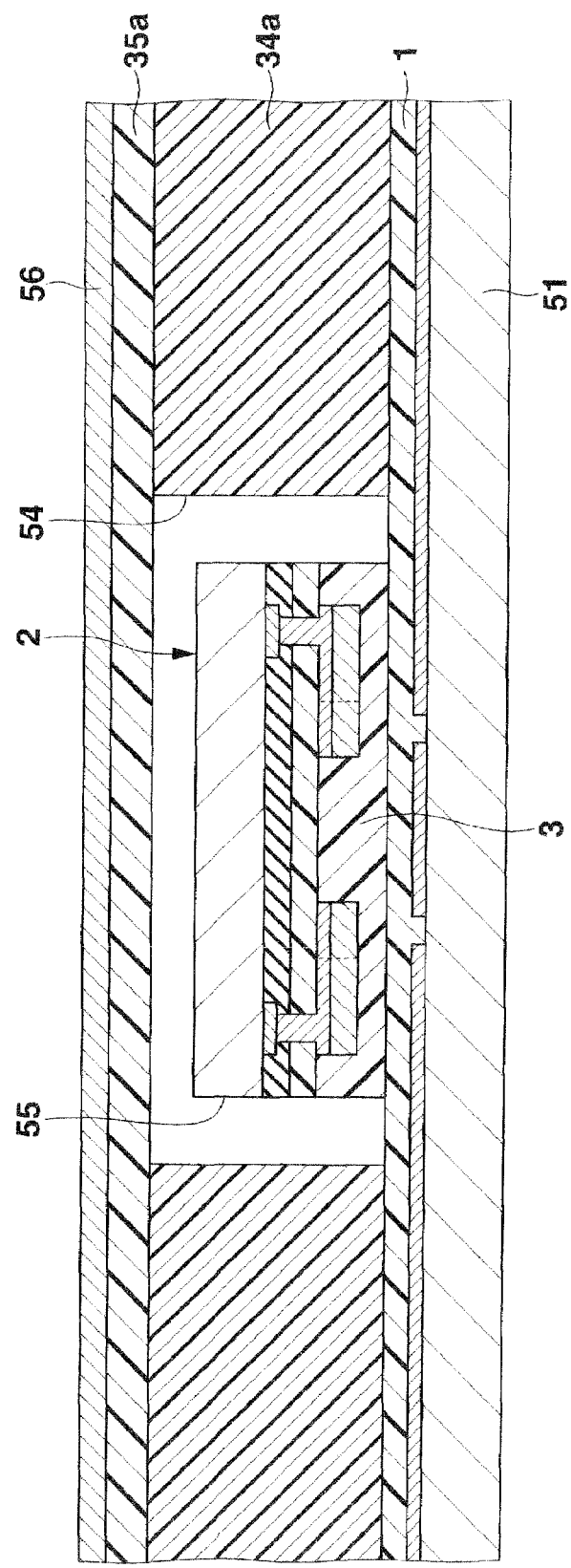
FIG. 6 is a sectional view of a step following FIG. 5.

Then, as shown in FIG. 6, a lattice-shaped insulating film forming sheet 34a is disposed on the upper surface of the lower insulating film 1 around the semiconductor construct 2 including the adhesive layer 3 while being positioned by, for example, pins. The insulating film forming sheet 34a is formed by impregnating a thermosetting resin made of, for example, an epoxy resin into a base material made of, for example, glass cloth, and semi-curing the thermosetting resin into a sheet state in which a plurality of square openings 54 are formed by, for example, punching. The size of the opening 54 of the insulating film forming sheet 34a is slightly larger than the size of the semiconductor construct 2. Thus, a space 55 is formed between the insulating film forming sheet 34a and the semiconductor construct 2.

Then, an upper insulating film forming layer 35a formed on the lower surface of a sub-base plate 54 made of copper foil is disposed on the upper surface of the insulating film forming sheet 34a. The upper insulating film forming layer 35a is made of the same material as the lower insulating film 1, of which material a thermosetting resin made of, for example, an epoxy resin is semi-cured.

Figure 7:
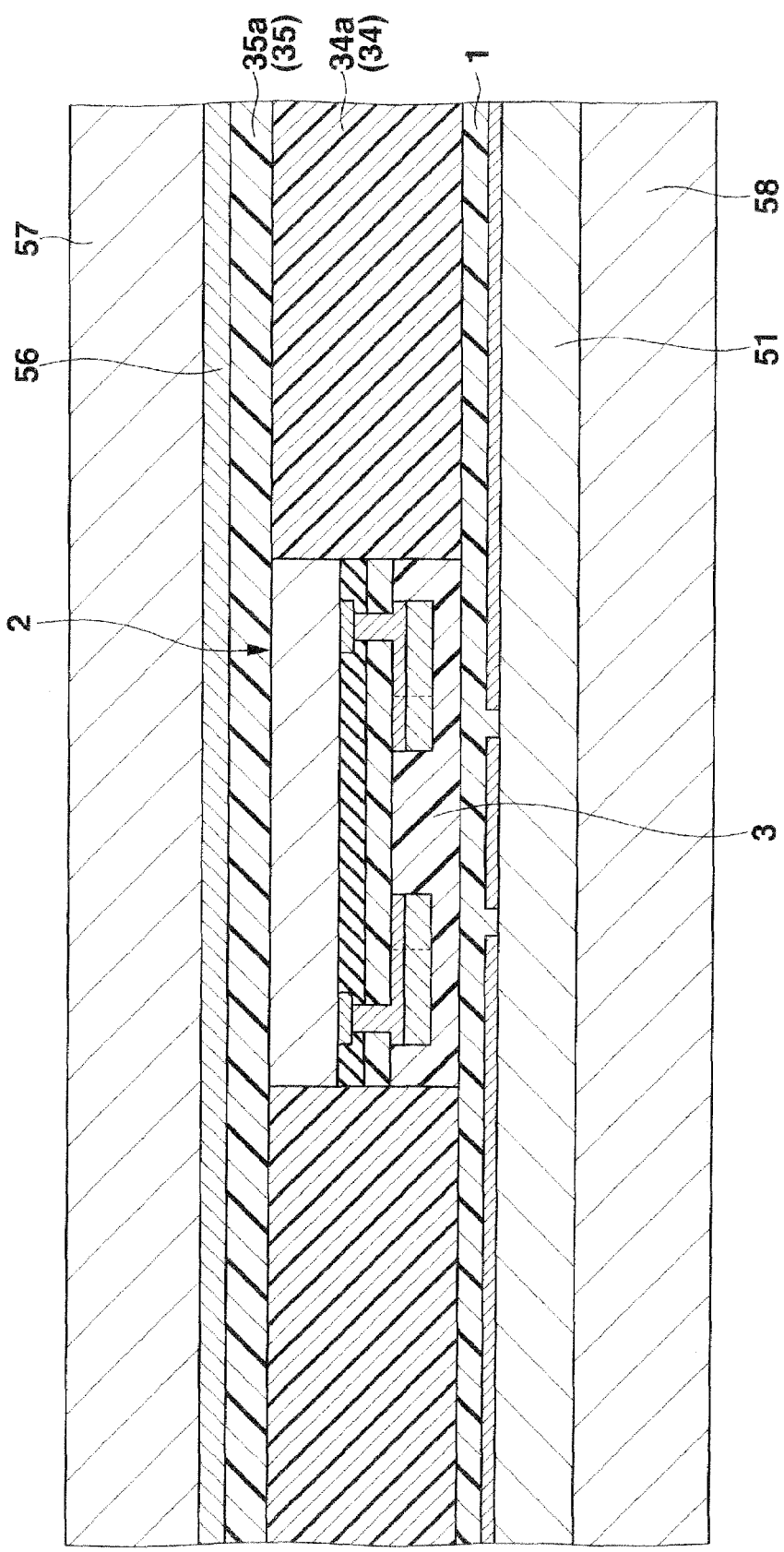
FIG. 7 is a sectional view of a step following FIG. 6.

Then, as shown in FIG. 7, the insulating film forming sheet 34a and the upper insulating film forming layer 35a are hot-pressed from the top and bottom using a pair of hot-pressing plates 57, 58. The thermosetting resin in the insulating film forming sheet 34a and the upper insulating film forming layer 35a flows due to the hot-pressing and is thus filled into the space 55 shown in FIG. 8, and is then solidified by subsequent cooling. Thus, the insulating layer 34 is formed on the upper surface of the lower insulating film 1 around the semiconductor construct 2 including the adhesive layer 3, and the upper insulating film 35 is formed on the upper surfaces of the semiconductor construct 2 and the insulating layer 34.

Here, as shown in FIG. 6, the lower insulating film 1 and the base plate 51 are disposed on the lower surface of the insulating film forming sheet 34a, and the upper insulating film forming layer 35a made of the same material as the lower insulating film 1 and the sub-base plate 54 made of the same material as the base plate 51 are disposed on the upper surface of the insulating film forming sheet 34a, so that the material configuration in the part of the insulating film forming sheet 34a in the thickness direction is symmetrical. As a result, the insulating film forming sheet 34a and the upper insulating film forming layer 35a symmetrically harden and contract in the thickness direction and thus do not easily warp as a whole, thus making it difficult for problems to arise in the subsequent steps and in respect of processing accuracy in the subsequent steps.

In this case, the lower insulating film 1 hardly deforms even if hot-pressed because the thermosetting resin thereof has been cured in advance. Moreover, the sub-base plate 54 can prevent the thermosetting resin of the upper insulating film forming layer 35a from unnecessarily adhering to the lower surface of the upper hot-pressing plate 57. Consequently, the upper hot-pressing plates 57 can be reused on an as-is basis.

Figure 8:
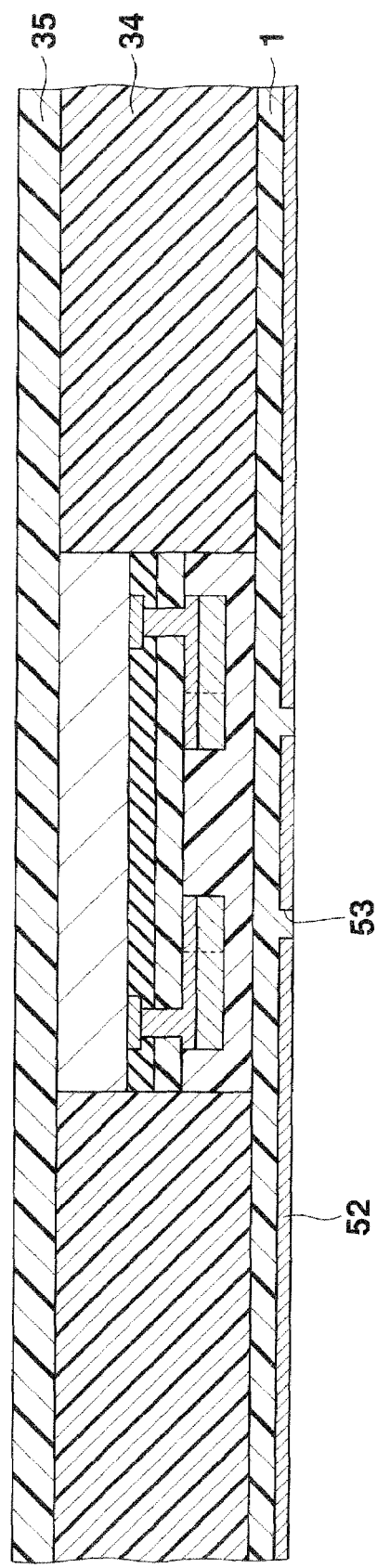
FIG. 8 is a sectional view of a step following FIG. 7.

Then, the base plate 51 and the sub-base plate 54 are removed by etching, such that the lower surface of the mask metal layer 52 including the lower insulating film 1 filled in the openings 53 is exposed, and the upper surface of the upper insulating film 35 is also exposed, as shown in FIG. 8. In this state, even if the base plate 51 and the sub-base plate 54 are removed, sufficient strength can be assured owing to the presence of the lower insulating film 1, the insulating layer 34 and the upper insulating film 35. Thus, in the present embodiment, the base plate 51 and the sub-base plate 54 that are required in the manufacturing process are removed by etching, which is advantageous in that the thickness of a completed semiconductor can be smaller.

Figure 9:
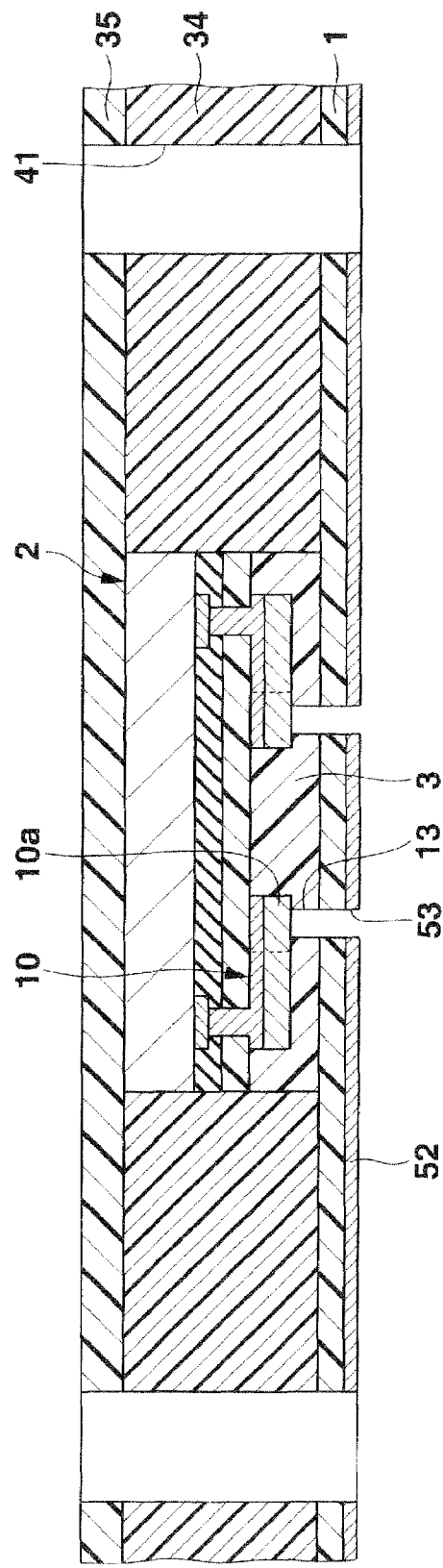
FIG. 9 is a sectional view of a step following FIG. 8.

Then, as shown in FIG. 9, by laser processing based on laser beam irradiation, the lower insulating film 1 in the openings 53 of the mask metal layer 52 is removed, and the opening 13 is formed in parts of the lower insulating film 1 and the adhesive layer 3 corresponding to the center of the lower surface of the connection pad portion 10a of the wiring line 10 of the semiconductor construct 2. Further, the through-hole 41 is formed in the lower insulating film 1, the insulating layer 34 and the upper insulating film 35 by use of a mechanical drill or by laser processing based on laser beam irradiation.

The case where the opening 13 is formed by laser beam irradiation is described. If a laser beam is directly applied to the lower insulating film 1 and the adhesive layer 3, an opening having a diameter corresponding to the diameter of the beam is formed. Here, the diameter of the opening 53 of the mask metal layer 52 is smaller than the diameter of the connection pad portion 10a of the wiring line 10 of the semiconductor construct 2. Thus, if the diameter of the laser beam is greater than the diameter of the connection pad portion 10a of the wiring line 10 of the semiconductor construct 2, the laser beam applied outside the opening 53 of the mask metal layer 52 is blocked by the mask metal layer 52, so that the diameter of the opening 13 formed in the lower insulating film 1 and the adhesive layer 3 corresponds to the diameter of the opening 53 of the mask metal layer 52.

That is, the mask metal layer 52 has the opening 53, such that the mask metal layer 52 functions as a mask when the opening 13 is formed in the lower insulating film 1 and the adhesive layer 3 by laser processing based on laser beam irradiation, and the opening 13 having the same diameter as the opening 53 of the mask metal layer 52 is formed in the lower insulating film 1 and the adhesive layer 3 in self-alignment with the opening 53 of the mask metal layer 52. In addition, the planar shape of the opening 13 is not limited to a circular shape, and the opening 13 can have various planar shapes by changing the opening 53 of the mask metal layer 52. The important point is that the planar shape of the opening 13 needs to be smaller than that of the connection pad portion 10a.

As a result, the diameter of the opening 13 to be formed in the lower insulating film 1 and the adhesive layer 3 can be as small as possible, and it becomes relatively easy to align the connection pad portion 10a of the wiring line 10 of the semiconductor construct 2 with the mask metal layer 52. Thus, the diameter of the connection pad portion 10a of the wiring line 10 of the semiconductor construct 2 can be as small as possible, and the semiconductor construct 2 can be miniaturized.

For example, the minimum diameter of the laser beam is about 50 μm in the present situation. If the laser beam is directly applied to the lower insulating film 1 and the adhesive layer 3, the diameter of an opening formed therein is about 70 μm. Therefore, in order to receive the maximum irradiation provided by the laser beam, the diameter of the connection pad portion 10a of the wiring line 10 of the semiconductor construct 2 has to be 100 to 120 μm, based on current methods, when the accuracy of laser processing is taken into account.

In contrast, in the method of the present embodiment in which the mask metal layer 52 serves as a mask for the laser beam, the diameter of the opening 53 of the mask metal layer 52 formed by the photolithographic method can be 20 to 50 μm, particularly 20 to 30 μm. Thus, the diameter of the connection pad portion 10a of the wiring line 10 of the semiconductor construct 2 can be 50 to 80 μm, particularly 50 to 60 μm. Accordingly, the semiconductor construct 2 can be miniaturized.

Figure 10:
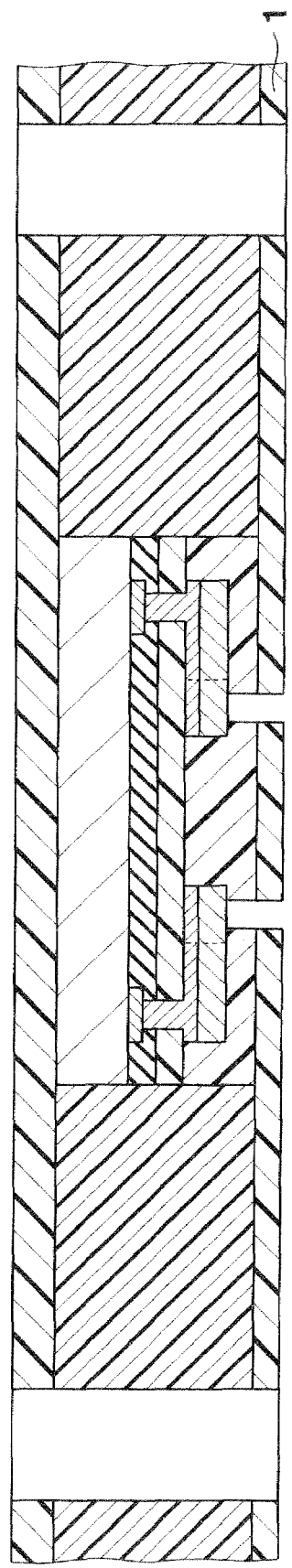
FIG. 10 is a sectional view of a step following FIG. 9.

Then, the mask metal layer 52 is removed by etching, such that the lower surface of the lower insulating film 1 is exposed, as shown in FIG. 10. Thus, in the present embodiment, the mask metal layer 52 required in the manufacturing process is removed by etching, which is advantageous in that the thickness of a completed semiconductor can be smaller.

Figure 11:
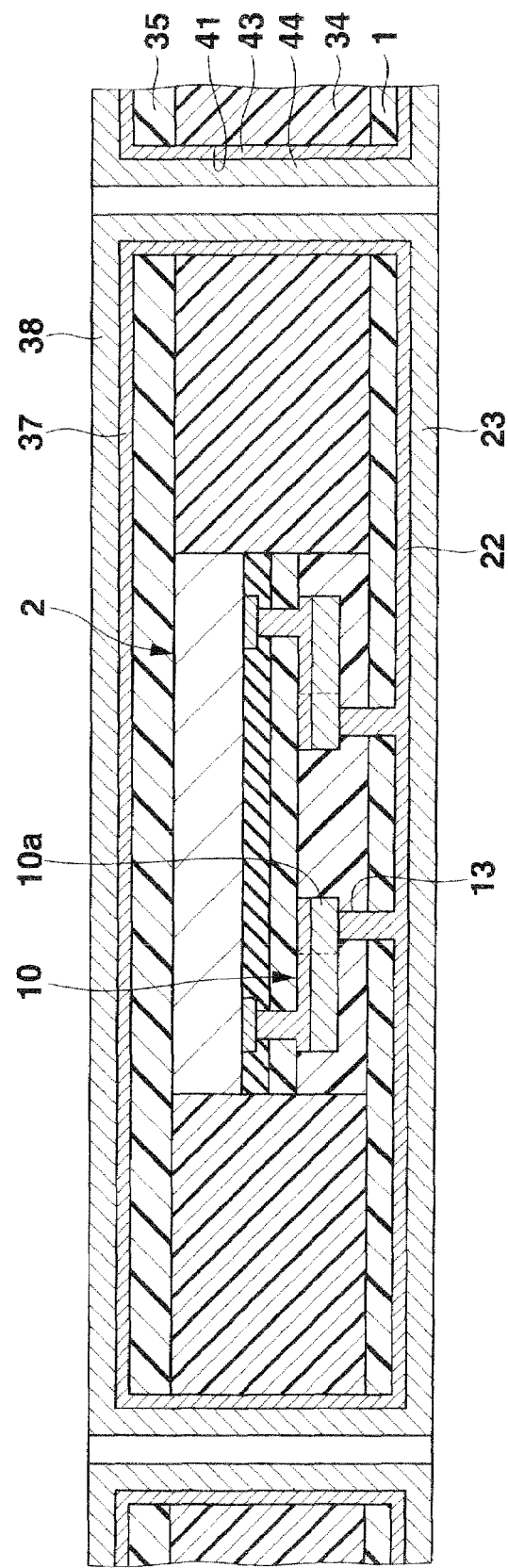
FIG. 11 is a sectional view of a step following FIG. 10.

Then, as shown in FIG. 11, the foundation metal layers 22, 37, 43 are formed by electroless plating with nickel on the entire lower surface of the lower insulating film 1 including the lower surface of the connection pad portion 10a of the wiring line 10 of the semiconductor construct 2 exposed via the opening 13 in the lower insulating film 1 and the adhesive layer 3, on the entire upper surface of the upper insulating film 35, and on the inner wall surface of the through-hole 41. Further, electrolytic plating with copper is carried out using the foundation metal layers 22, 37, 43 as plating current paths, thereby forming the upper metal layers 23, 38, 44 on the surfaces of the foundation metal layers 22, 37, 43.

Figure 12:
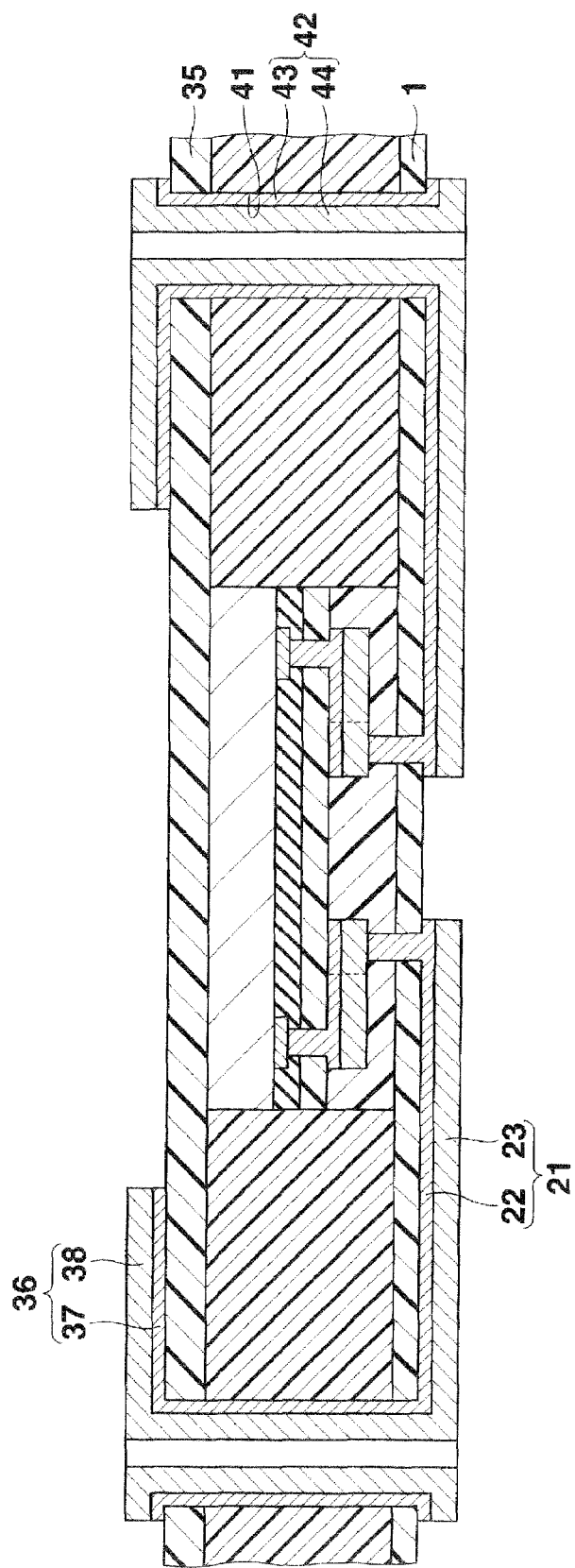
FIG. 12 is a sectional view of a step following FIG. 11.

Then, the upper metal layers 23, 38 and the foundation metal layers 22, 37 are patterned by the photolithograohic method, the result of which is as shown in FIG. 12. That is, the lower wiring line 21 having the double-layer structure composed of the foundation metal layer 22 and the upper metal layer 23 is formed on the lower surface of the lower insulating film 1. Further, the upper wiring line 36 having the double-layer structure composed of the foundation metal layer 37 and the upper metal layer 38 is formed on the upper surface of the upper insulating film 35. Still further, the vertical conducting portion 42 having the double-layer structure composed of the foundation metal layer 43 and the upper metal layer 44 is formed on the inner wall surface of the through-hole 41. In addition, the lower wiring line 21, the upper wiring line 36 and the vertical conducting portion 42 may be formed by a pattern plating method for forming the upper metal layers 23, 38, 44 through electrolytic plating, after a plating resist film in which an upper metal layer formation region has been removed is formed on the foundation metal layers 22, 37. Moreover, although the foundation metal layer 22 alone is formed in the opening 13 in each of the drawings for convenience, it is also possible to form the upper metal layer 23 in the opening 13 together with the foundation metal layer 22.

Figure 13:
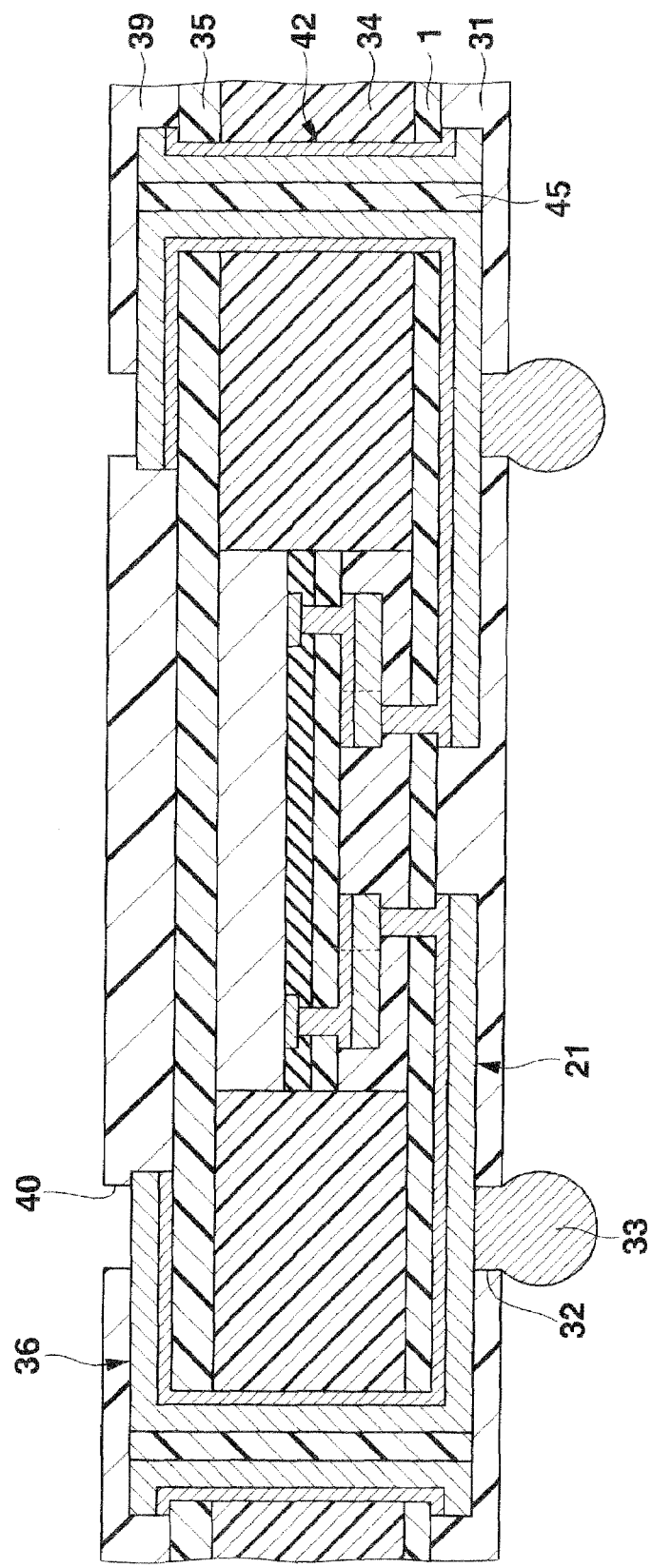
FIG. 13 is a sectional view of a step following FIG. 12.

Then, as shown in FIG. 13, the lower overcoat film 31 made of, for example, a solder resist is formed on the lower surface of the lower insulating film 1 including the lower wiring line 21 by, for example, a screen printing method or a spin coat method. Further, the upper overcoat film 39 made of, for example, a solder resist is formed on the upper surface of the upper insulating film 35 including the upper wiring line 36 by, for example, the screen printing method or the spin coat method. In this state, the filling material 45 made of, for example, a solder resist is filled in the vertical conducting portion 42.

Then, the opening 32 is formed by laser processing based on laser beam irradiation in the part of the lower overcoat film 31 corresponding to the connection pad portion of the lower wiring line 21. Further, the opening 40 is formed by laser processing based on laser beam irradiation in the part of the upper overcoat film 39 corresponding to the connection pad portion of the upper wiring line 36.

Then, the solder ball 33 is formed in and under the opening 32 of the lower overcoat film 31 so that this solder ball is connected to the connection pad portion of the lower wiring line 21. Then, the lower overcoat film 31, the lower insulating film 1, the insulating layer 34, the upper insulating film 35 and the upper overcoat film 39 are cut between the adjacent semiconductor constructs 2, such that a plurality of semiconductor devices shown in FIG. 1 are obtained.

Second Embodiment

Figure 14:
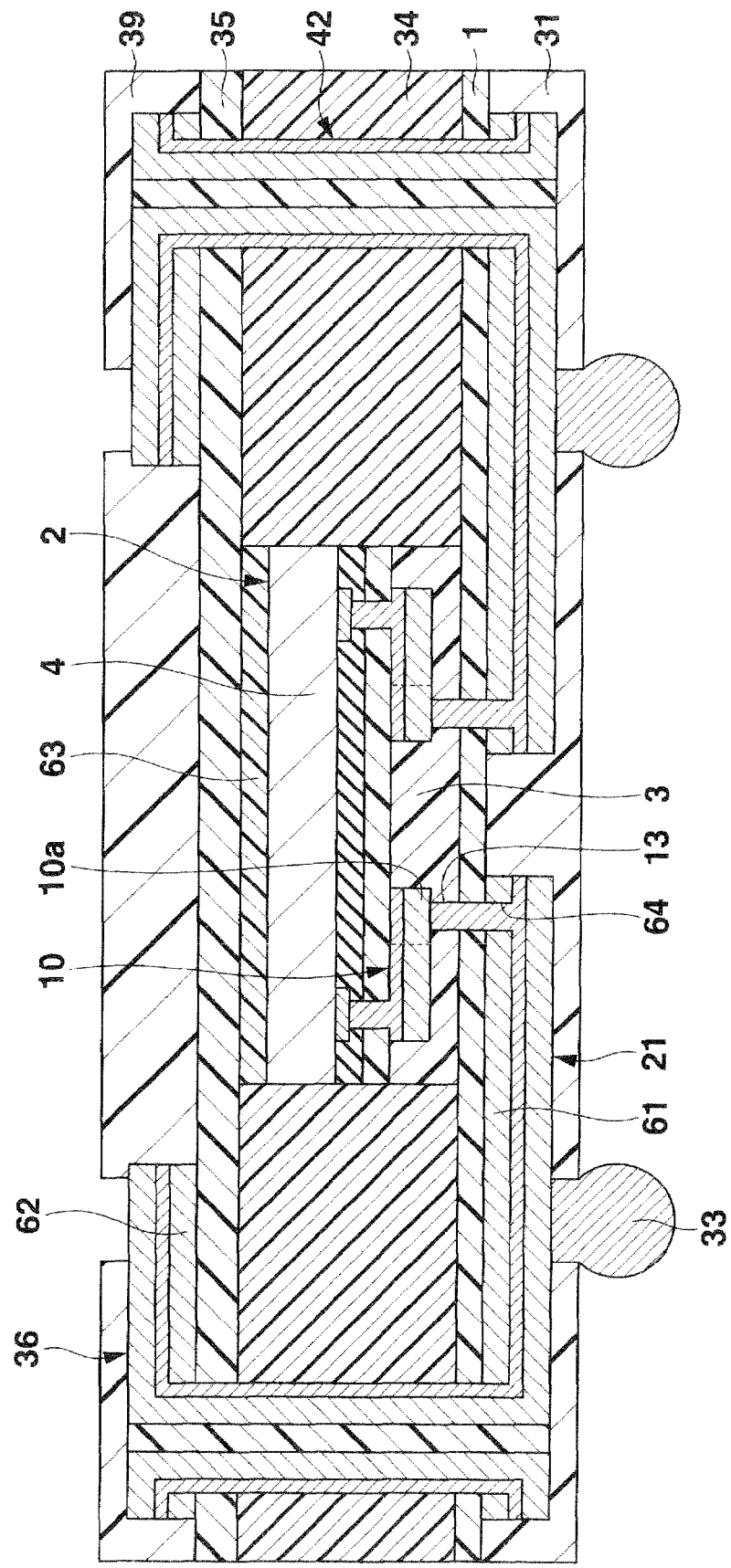
FIG. 14 is a sectional view of a semiconductor device as a second embodiment of this invention.

FIG. 14 shows a sectional view of a semiconductor device as a second embodiment of this invention. This semiconductor device is different from the semiconductor device shown in FIG. 1 in that a lower metal layer 61 made of copper is provided between a lower wiring line 21 and a lower insulating film 1, in that a lower metal layer 62 made of copper is provided between an upper wiring line 36 and an upper insulating film 35, and in that the upper surface of a silicon substrate 4 of a semiconductor construct 2 is adhesively bonded to the lower surface of the upper insulating film 35 via an adhesive layer 63 made of, for example, an epoxy resin. In this case, one end of the lower wiring line 21 is connected to a connection pad portion 10a of a wiring line 10 of the semiconductor construct 2 via an opening 64 of the lower metal layer 61 and an opening 13 of an adhesive layer 3 and the lower insulating film 21.

Figure 15:
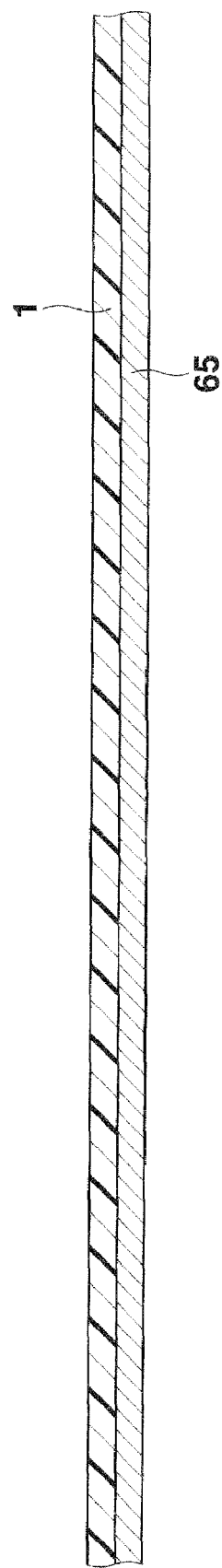
FIG. 15 is a view for explaining one example of a method of manufacturing the semiconductor device in the second embodiment of this invention.

Next, one example of a method of manufacturing this semiconductor device is described. First, as shown in FIG. 15, a laminated sheet is prepared in which a solid mask metal layer 65 made of copper foil is fixedly connected to the lower surface of the lower insulating film 1 made of a sheet of, for example, an epoxy resin, a polyimide resin, or an epoxy resin having a glass cloth base material. In this case as well, this prepared unit is sized so that a plurality of completed semiconductor devices shown in FIG. 14 can be formed.

Figure 16:
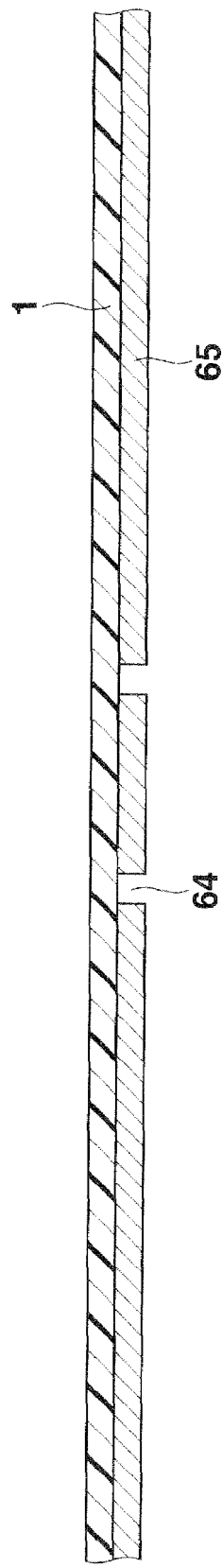
FIG. 16 is a sectional view of a step following FIG. 15.

Then, as shown in FIG. 16, the opening 64 having a circular planar shape is formed by the photolithographic method at a predetermined point of the mask metal layer 65 (a part corresponding to the center of the lower surface of the connection pad portion 10a of the wiring line 10 of the semiconductor construct 2 shown in FIG. 14).

Figure 17:
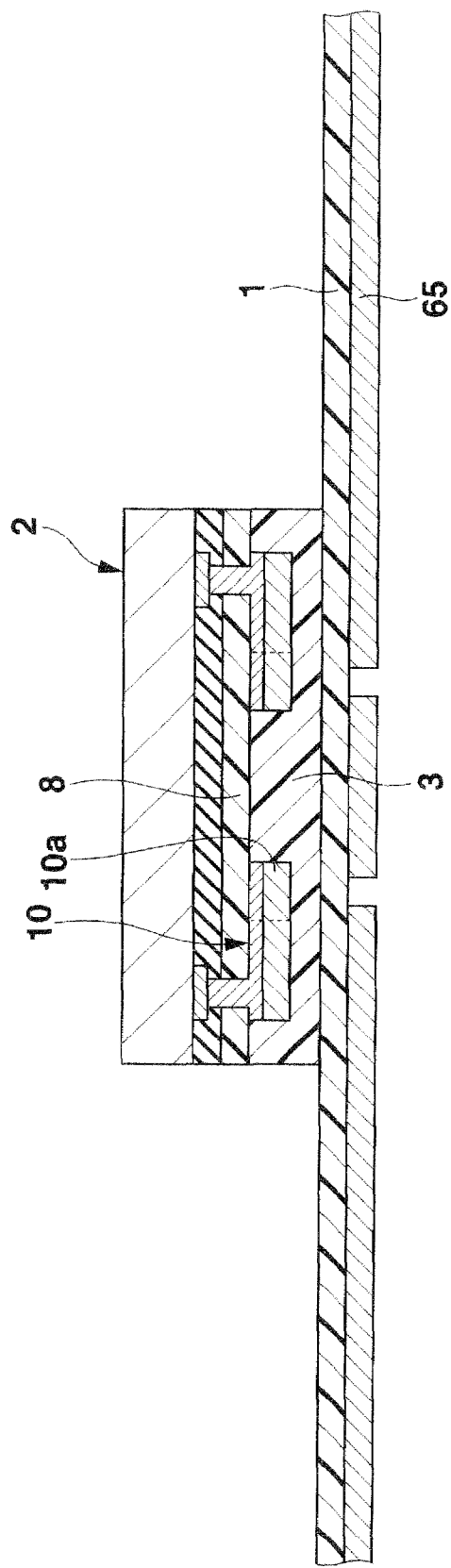
FIG. 17 is a sectional view of a step following FIG. 16.

Then, as shown in FIG. 17, the lower surface of a protective film 8 including the wiring lines 10 of the semiconductor construct 2 is adhesively bonded to a semiconductor construct installation region on the upper surface of the lower insulating film 1 via the adhesive layer 3 made of, for example, an epoxy resin, such that the semiconductor construct 2 is installed thereon. In this case as well, the semiconductor construct installation region on the upper surface of the lower insulating film 1 is previously supplied with an adhesive called an NCP or an adhesive sheet called an NCF, and the semiconductor construct 2 is fixedly connected onto the upper surface of the lower insulating film 1 by hot press bonding.

Figure 18:
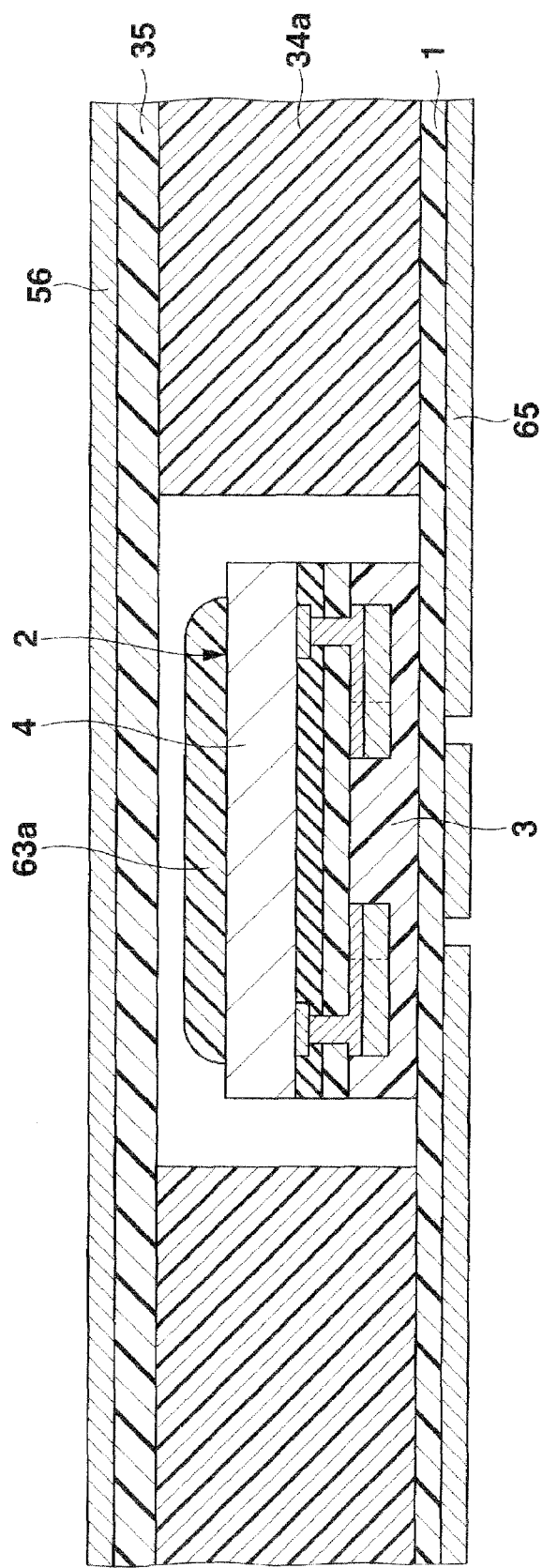
FIG. 18 is a sectional view of a step following FIG. 17.

Then, as shown in FIG. 18, a lattice-shaped insulating film forming sheet 34a is disposed on the upper surface of the lower insulating film 1 around the semiconductor construct 2 including the adhesive layer 3 while being positioned by, for example, pins. Further, a liquid adhesive 62a made of, for example, an epoxy resin containing a silicon coupling agent is applied onto the upper surface of the silicon substrate 4 of the semiconductor construct 2 using, for example, a dispenser. Then, the upper insulating film 35 formed on the lower surface of a sub-base plate 56 made of copper foil is disposed on the upper surface of the insulating film forming sheet 34a. In this case, a thermosetting resin made of, for example, an epoxy resin in the upper insulating film 35 has been already cured.

Figure 19:
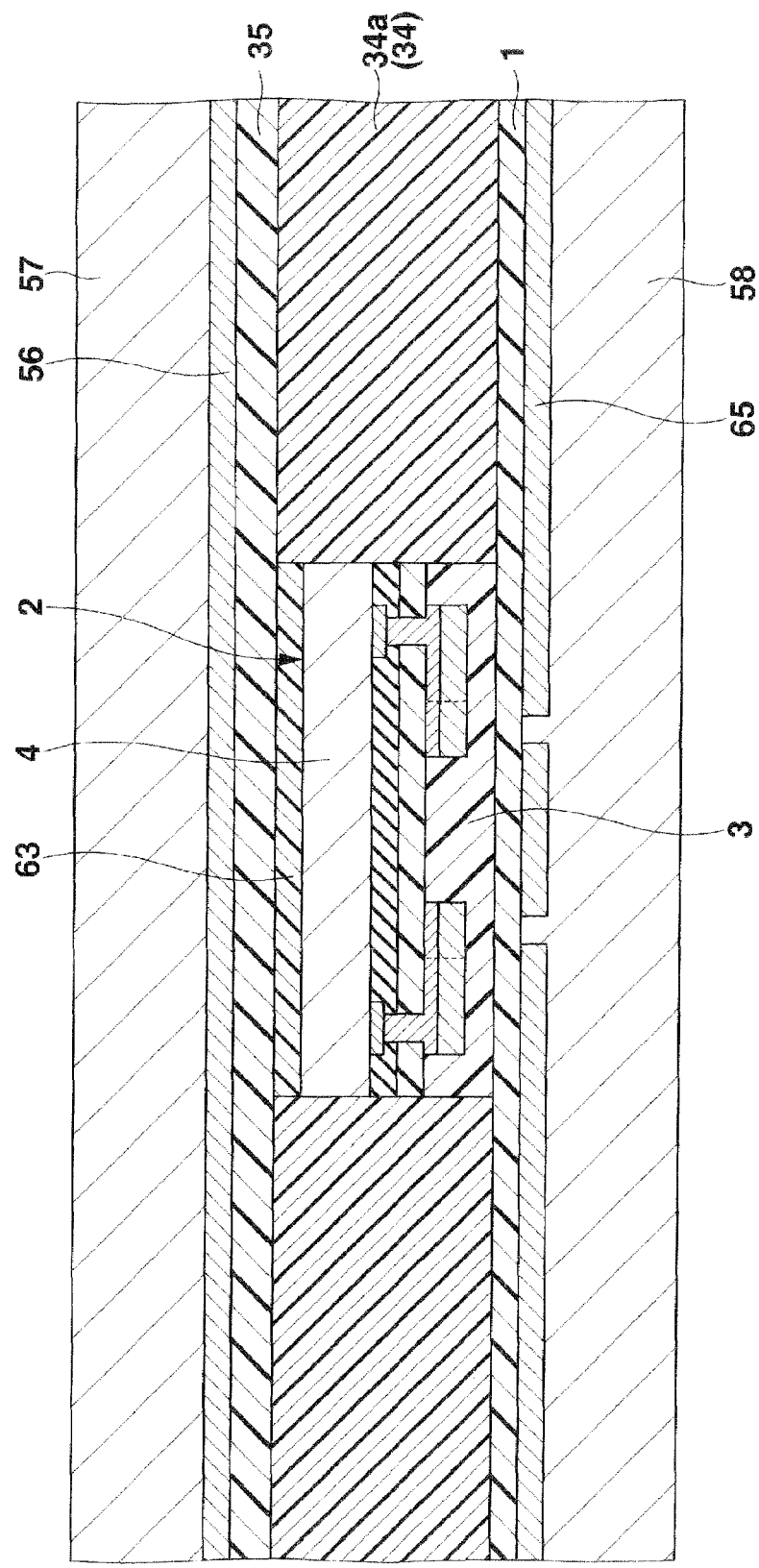
FIG. 19 is a sectional view of a step following FIG. 18.

Then, as shown in FIG. 19, owing to a hot press process applied from the top and bottom using a pair of hot-pressing plates 57, 58, an insulating layer 34 is formed on the upper surface of the lower insulating film 1 around the semiconductor construct 2 including the adhesive layer 3, and the upper surface of the silicon substrate 4 of the semiconductor construct 2 is adhesively bonded to the lower surface of the upper insulating film 35 via the adhesive layer 63, and then the lower surface of the upper insulating film 35 is fixedly connected to the upper surface of the insulating layer 34.

Figure 20:
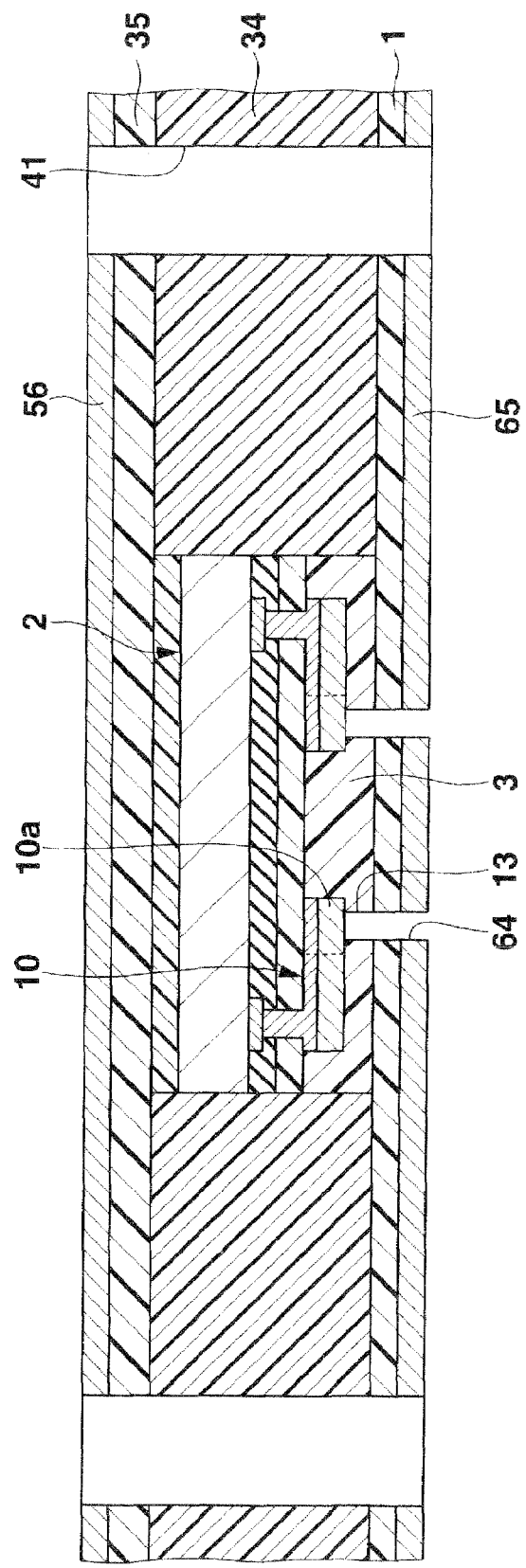
FIG. 20 is a sectional view of a step following FIG. 19.

Then, as shown in FIG. 20, the mask metal layer 65 having the opening 64 is used as a mask to form, by laser processing based on laser beam irradiation, the opening 13 in parts of the lower insulating film 1 and the adhesive layer 3 corresponding to the center of the lower surface of the connection pad portion 10a of the wiring line 10 of the semiconductor construct 2. Further, a through-hole 41 is formed at predetermined places of the lower insulating film 1, the insulating layer 34, the upper insulating film 35 and the sub-base plate 56 by use of a mechanical drill or by laser processing based on laser beam irradiation.

Figure 21:
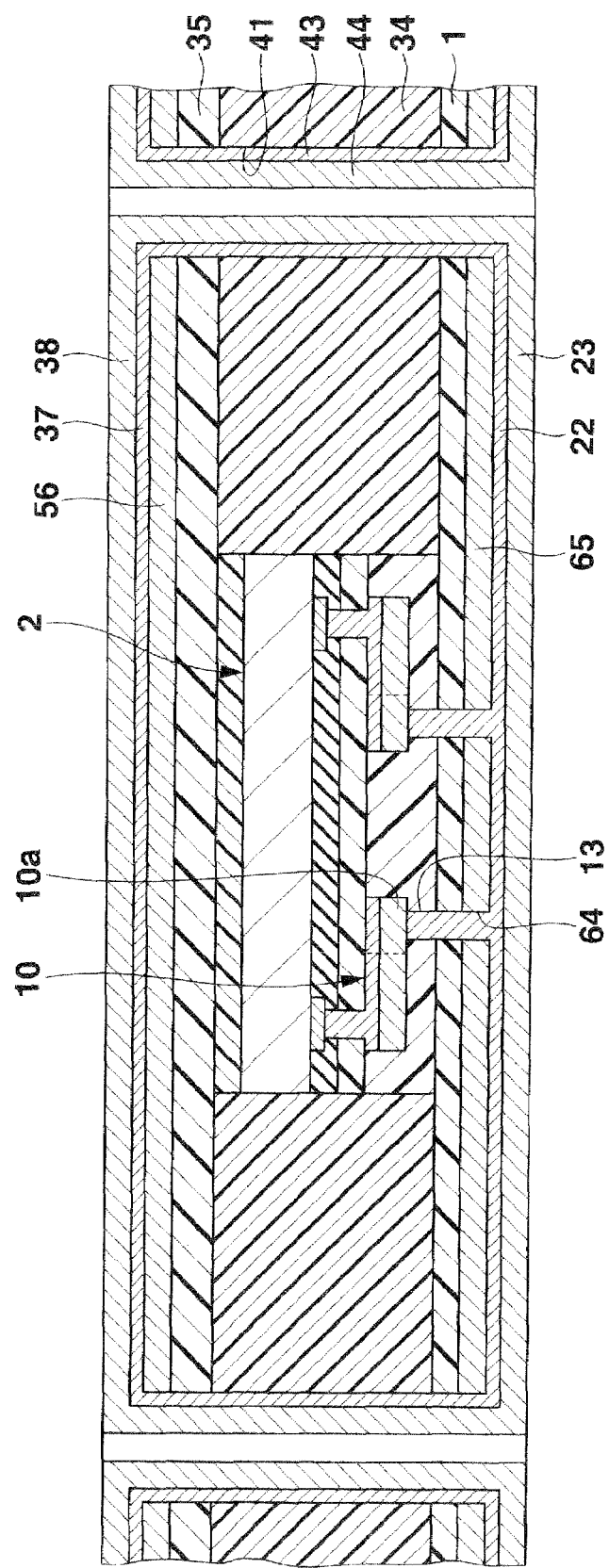
FIG. 21 is a sectional view of a step following FIG. 20.

Then, as shown in FIG. 21, foundation metal layers 22, 37, 43 are formed by electroless plating with nickel on the entire lower surface of the mask metal layer 65 including the lower surface of the connection pad portion 10a of the wiring line 10 of the semiconductor construct 2 exposed via the opening 64 of the mask metal layer 65 and via the opening 13 in the lower insulating film 1 and the adhesive layer 3, on the entire upper surface of the sub-base plate 56, and on the inner wall surface of the through-hole 41. Further, electrolytic plating with copper is carried out using the foundation metal layers 22, 37, 43 as plating current paths, thereby forming the upper metal layers 23, 38, 44 on the surface of the foundation metal layers 22, 37, 43.

Figure 22:
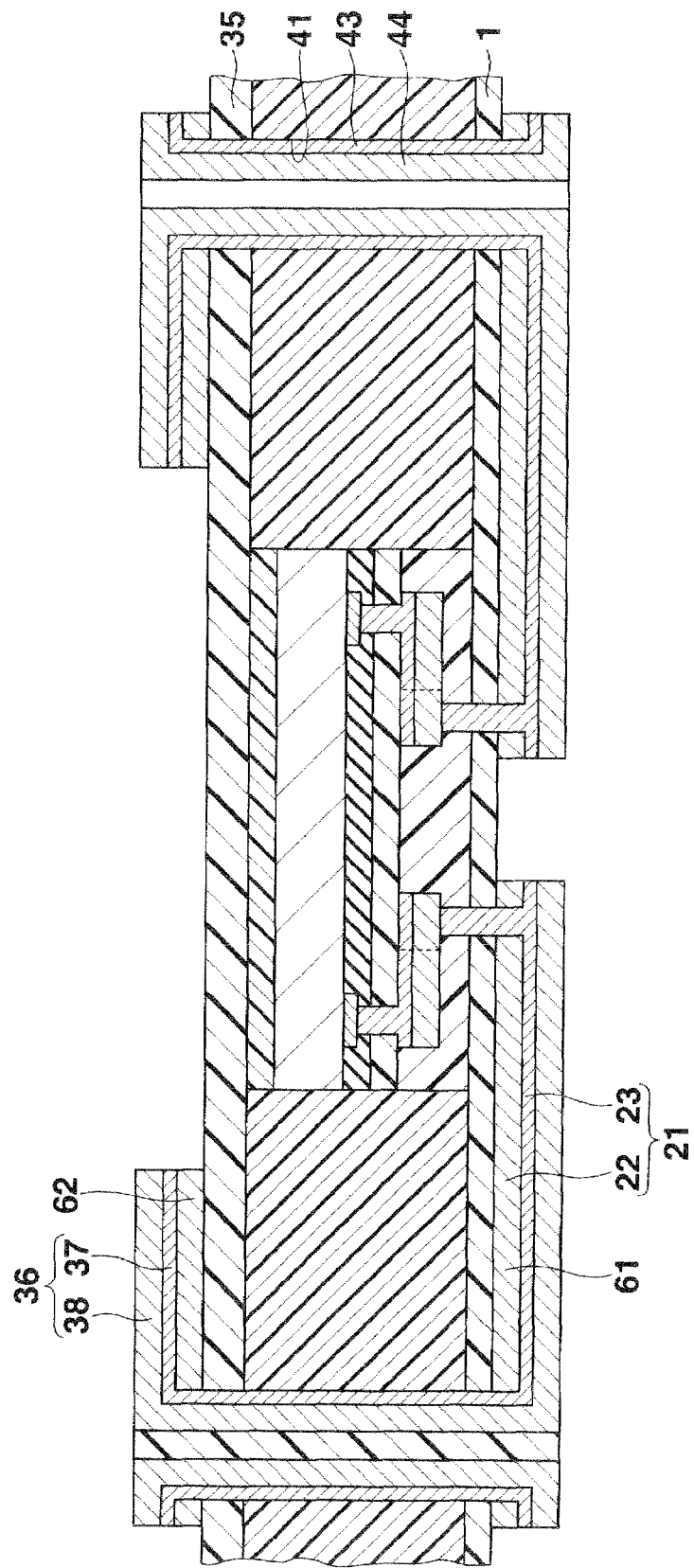
FIG. 22 is a sectional view of a step following FIG. 21.

Then, by the photolithographic method, the upper metal layer 23, the foundation metal layer 22 and the mask metal layer 65 are patterned, and the upper metal layer 38, the foundation metal layer 37 and the sub-base plate 56 are also patterned, the result of which is as shown in FIG. 22. That is, the lower wiring line 21 is formed on the lower surface of the lower insulating film 1, and this lower wiring line 21 has the lower metal layer 61 and has a double-layer structure composed of the foundation metal layer 22 and the upper metal layer 23 which have the same planar shape as the lower metal layer 61. Next, the upper wiring line 36 having the lower metal layer 62 and having the double-layer structure composed of the foundation metal layer 37 and the upper metal layer 38 is formed on the upper surface of the upper insulating film 35. After that, the vertical conducting portion 42 having the double-layer structure composed of the foundation metal layer 43 and the upper insulating film 35 is formed on the inner wall surface of the through-hole 41. Subsequently, after steps similar to those in the first embodiment described above, a plurality of semiconductor devices shown in FIG. 13 are obtained.

Third Embodiment

Figure 23:
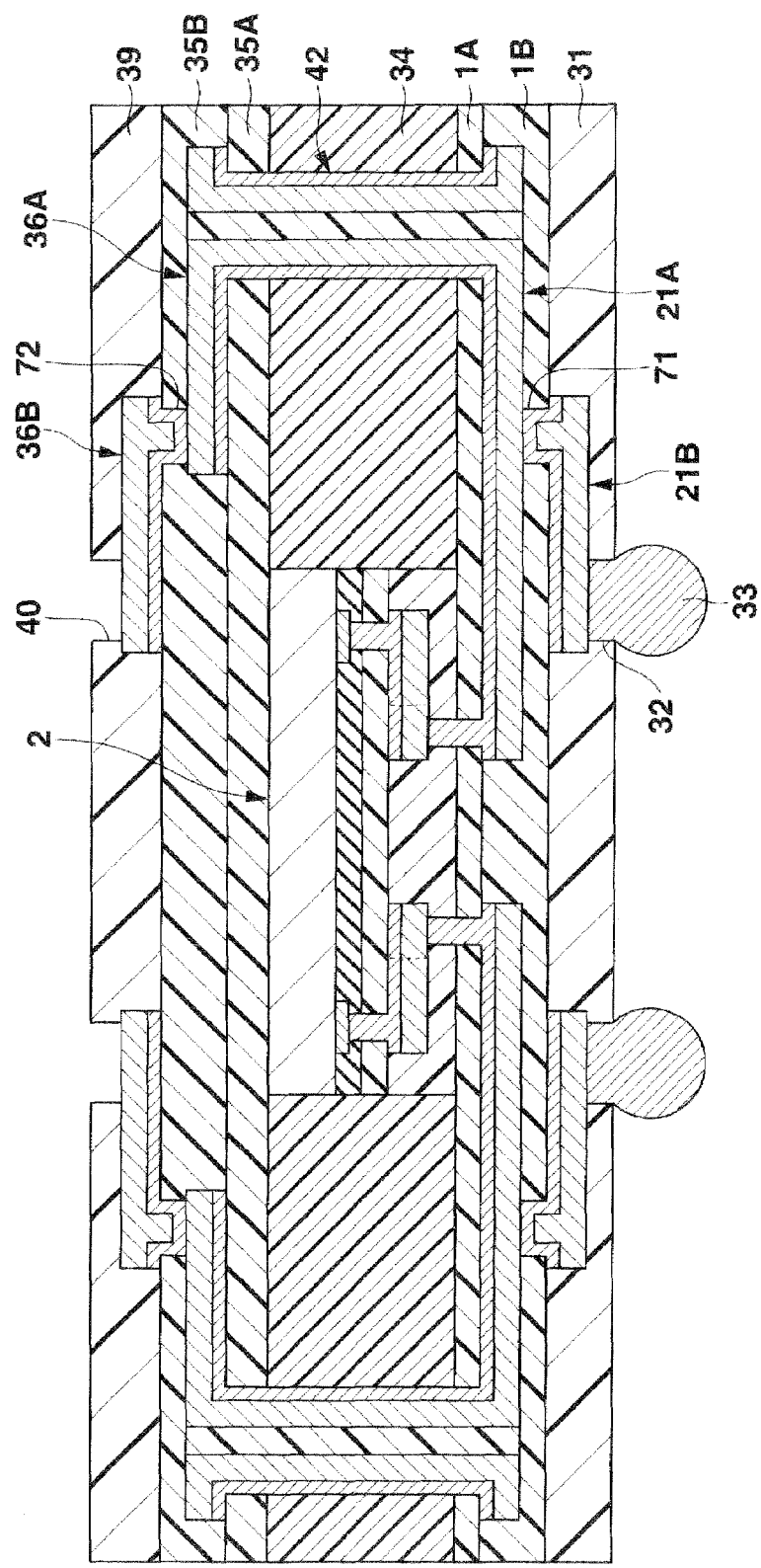
FIG. 23 is a sectional view of a semiconductor device as a third embodiment of this invention.

FIG. 23 shows a sectional view of a semiconductor device as a third embodiment of this invention. This semiconductor device is greatly different from the semiconductor device shown in FIG. 1 in that both a lower wiring line and an upper wiring line are formed to have a double-layer wiring structure by use of a build-up method. That is, a second lower insulating film 1B made of the same material as a first lower insulating film 1A is provided on the lower surface of the first lower insulating film 1A including a first lower wiring line 21A and a lower wiring line 21.

One end of a second lower wiring line 21B provided on the lower surface of the second lower insulating film 1B is connected to the connection pad portion of the first lower wiring line 21A via an opening 71 provided in the second lower insulating film 1B. A lower overcoat film 31 is provided on the lower surface of the second lower insulating film 1B including the second lower wiring line 21B. A solder ball 33 is provided in and under an opening 32 of the lower overcoat film 31 so that this solder ball is connected to the connection pad portion of the second lower wiring line 21B.

A second upper insulating film 35B made of the same material as a first upper insulating film 35A is provided on the upper surface of the first upper insulating film 35A including a first upper wiring line 36A. One end of a second upper wiring line 36B provided on the upper surface of the second upper insulating film 35B is connected to the connection pad portion of the first upper wiring line 36A via an opening 72 provided in the second upper insulating film 35B. An upper overcoat film 39 is provided on the upper surface of the second upper insulating film 35B including the second upper wiring line 36B. An opening 40 is provided in the part of the upper overcoat film 39 corresponding to the connection pad portion of the second upper wiring line 36B. In addition, both the lower wiring line and the upper wiring line may have a wiring structure of three or more layers.

Fourth Embodiment

Figure 24:
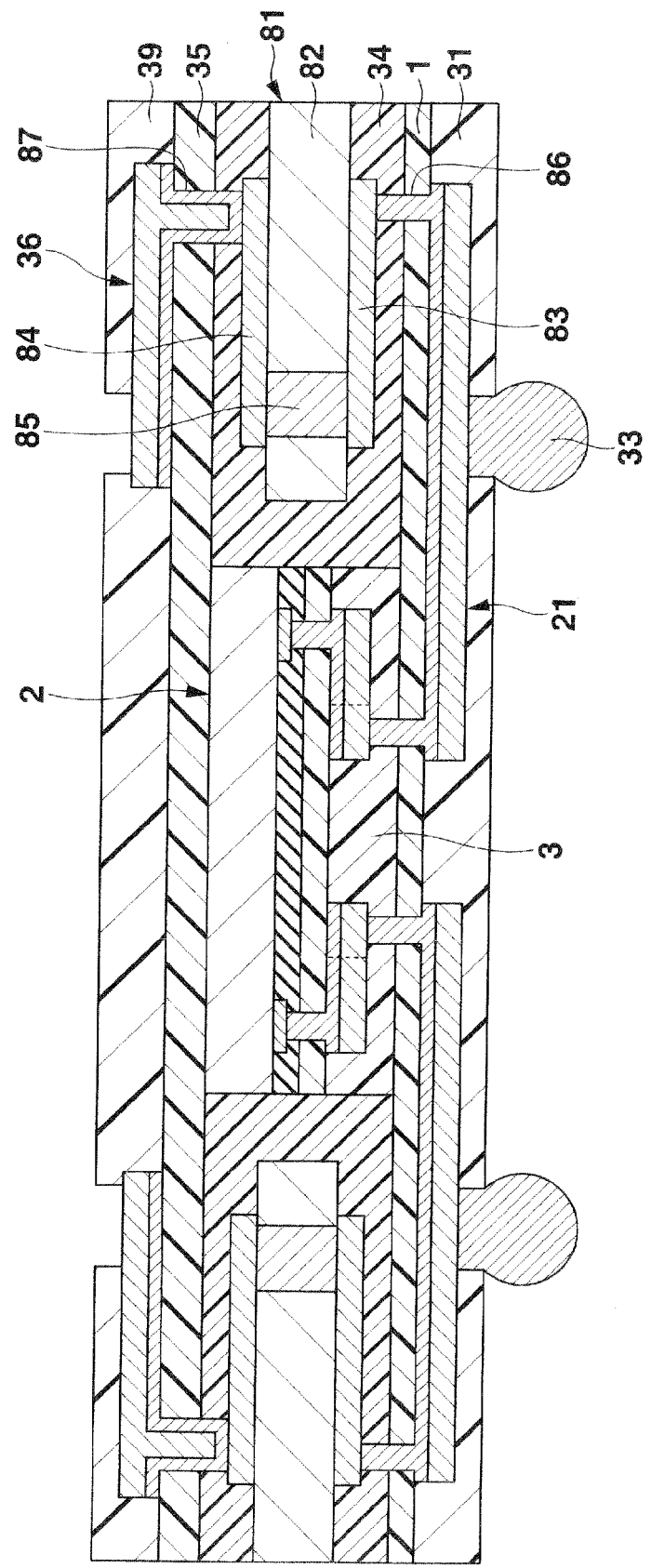
FIG. 24 is a sectional view of a semiconductor device as a fourth embodiment of this invention.

FIG. 24 shows a sectional view of a semiconductor device as a fourth embodiment of this invention. This semiconductor device is greatly different from the semiconductor device shown in FIG. 1 in that no vertical conducting portion 42 is provided, but a square frame-like circuit board 81 having a double-sided wiring structure is disposed instead in such a manner to as to be embedded into an insulating layer 34 around a semiconductor construct 2 including an adhesive layer 3.

In this case, the circuit board 81 comprises a square frame-like substrate 82 made of, for example, an epoxy resin having a glass cloth base material. A lower wiring line 83 made of copper foil is disposed on the lower surface of the substrate 82, while an upper wiring line 84 made of copper foil is disposed on the upper surface thereof. The lower wiring line 83 and the upper wiring line 84 are connected to each other via a vertical conducting portion 85 made of a conductive paste provided within the substrate 82.

A lower wiring line 21 is connected to the connection pad portion of the lower wiring line 83 of the circuit board 81 via an opening 86 provided in a lower insulating film 1 and the insulating layer 34. An upper wiring line 36 is connected to the connection pad portion of the upper wiring line 84 of the circuit board 81 via an opening 87 provided in an upper insulating film 35 and the insulating layer 34.

Figure 25:
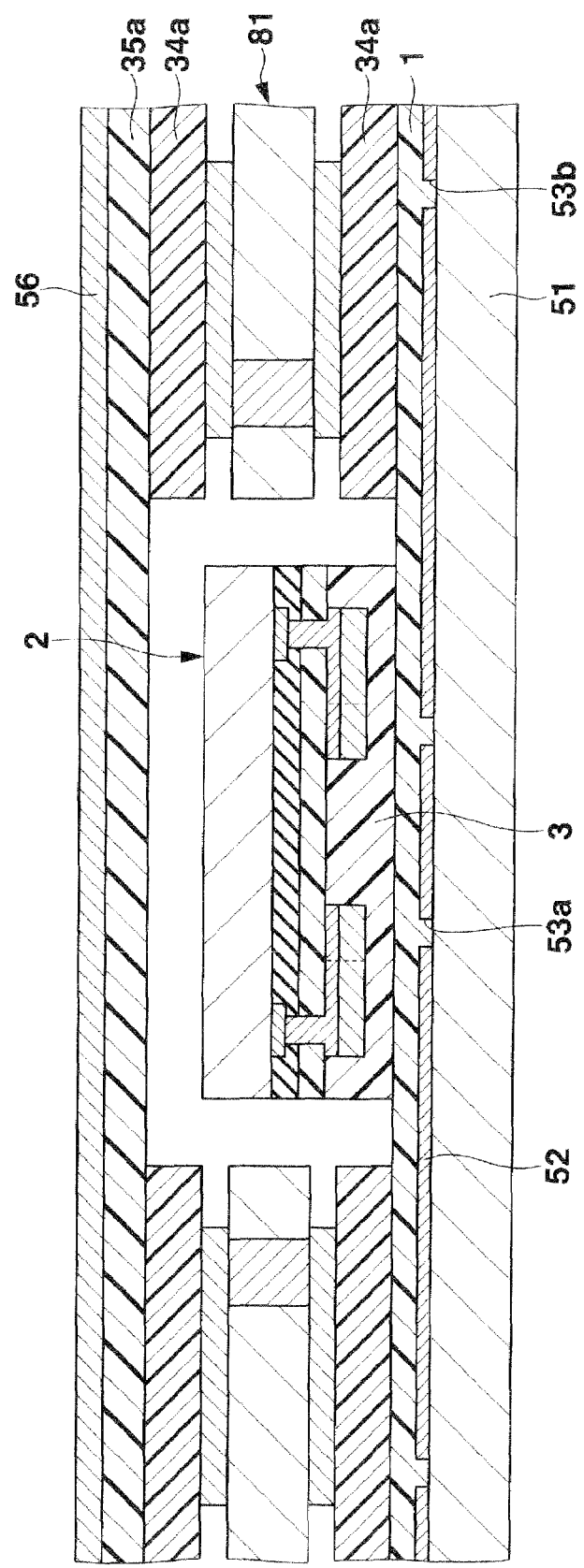
FIG. 25 is a sectional view of a predetermined step in one example of a method of manufacturing the semiconductor device shown in FIG. 24.

Next, one example of a method of manufacturing this semiconductor device is described. In this case, in a step as shown in FIG. 6, a lattice-shaped insulating film forming sheet 34a and the lattice-shaped circuit board 81 are disposed on the upper surface of the lower insulating film 1 around the semiconductor construct 2 including the adhesive layer 3 while being positioned by, for example, pins, as shown in FIG. 25. Further, an upper insulating film forming layer 35a formed on the lower surface of a sub-base plate 56 is disposed on the upper surface of the upper insulating film forming sheet 34a. In this case, openings 53a, 53b are formed in parts of a mask metal layer 52 corresponding to the center of the lower surface of a connection pad portion 10 of a wiring line 10 of the semiconductor construct 2 and the center of the lower surface of a connection pad portion of the lower wiring line 83 of the circuit board 81.

Figure 26:
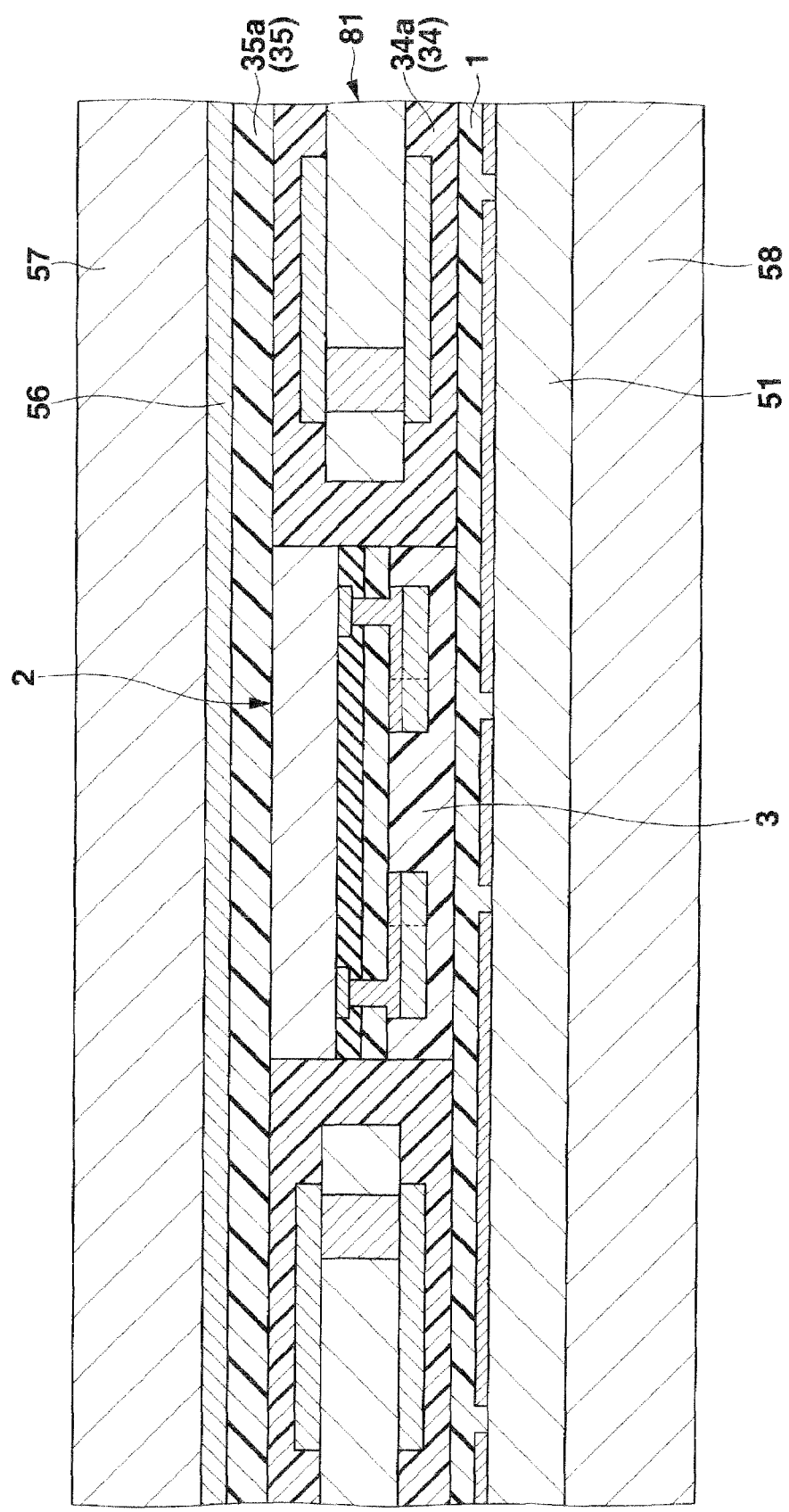
FIG. 26 is a sectional view of a step following FIG. 25.
Figure 27:
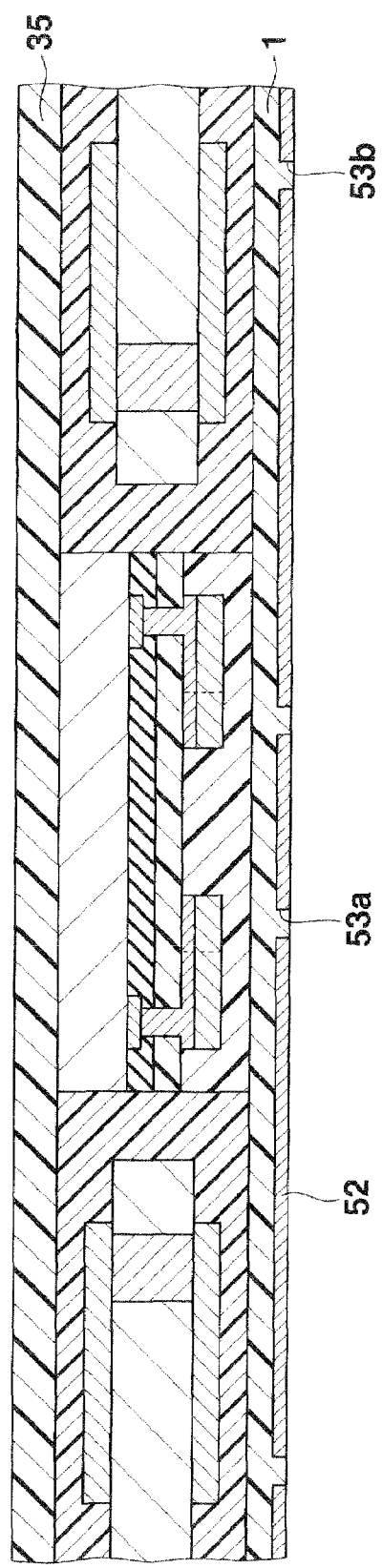
FIG. 27 is a sectional view of a step following FIG. 26.

Then, as shown in FIG. 26, owing to a hot press process performed from the top and bottom using a pair of hot-pressing plates 57, 58, the insulating layer 34 is formed on the upper surface of the lower insulating film 1 around the semiconductor construct 2 including the adhesive layer 3, and the circuit board 81 is embedded in the insulating layer 34, so that the upper insulating film 35 is formed on the upper surface of the semiconductor construct 2 and the insulating layer 34. Further, a base plate 51 and the sub-base plate 56 are removed by etching, such that the lower surface of the mask metal layer 52 including the lower insulating film 1 filled in the openings 53a, 53b of the mask metal layer 52 is exposed, and the upper surface of the upper insulating film 35 is also exposed, as shown in FIG. 27.

Figure 28:
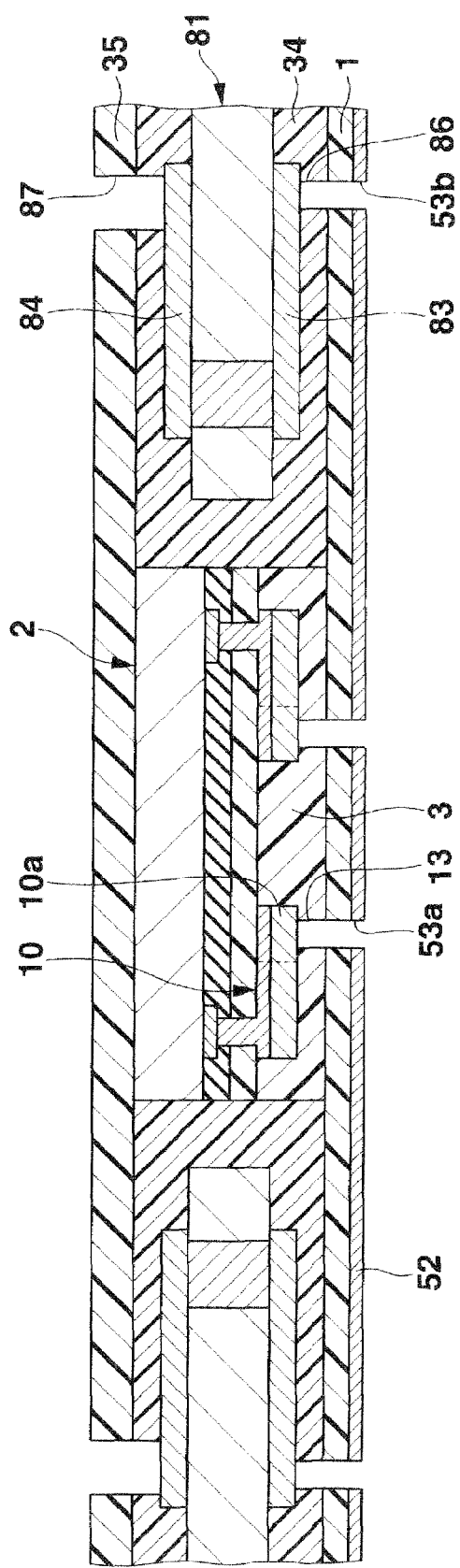
FIG. 28 is a sectional view of a step following FIG. 27.

Then, as shown in FIG. 28, the mask metal layer 52 having the openings 53a, 53b is used as a mask to form, by laser processing based on laser beam irradiation, an opening 13 in parts of the lower insulating film 1 and the adhesive layer 3 corresponding to the center of the lower surface of the connection pad portion 10a of the wiring line 10 of the semiconductor construct 2, and the opening 86 in parts of the lower insulating film 1 and the insulating layer 34 corresponding to the center of the lower surface of the connection pad portion of the lower wiring line 83 of the circuit board 81. In this case, the diameter of the opening 86 is equal to the diameter of the opening 13.

Then, the opening 87 is formed in parts of the upper insulating film 35 and the insulating layer 34 corresponding to the connection pad portion of the upper wiring line 84 of the circuit board 81 by laser processing based on laser beam irradiation. In this case, the diameter of the opening 87 is greater than the diameter of the opening 13. Subsequently, after steps similar to those in the first embodiment described above, a plurality of semiconductor devices shown in FIG. 24 are obtained.

As compared with the semiconductor device shown in FIG. 24, the lower insulating film and the upper insulating film are single-layered even when the lower wiring line and the upper wiring line have a double-layer structure in the semiconductor device obtained as described above, so that the thickness can be reduced accordingly. Moreover, as no vertical conducting portion 42 is provided, there is no need to form a through-hole 41 by a mechanical drill.

Fifth Embodiment

Figure 29:
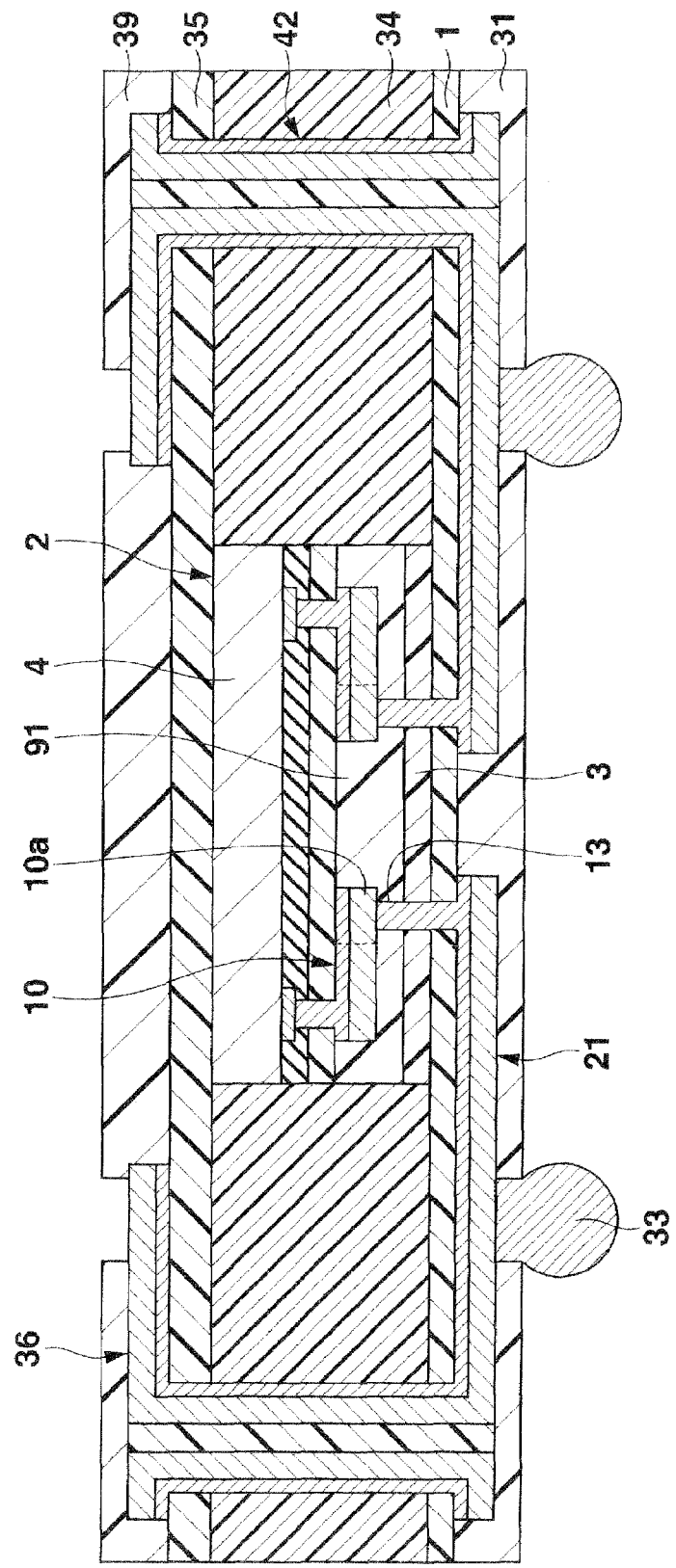
FIG. 29 is a sectional view of a semiconductor device as a fifth embodiment of this invention.

FIG. 29 shows a sectional view of a semiconductor device as a fifth embodiment of this invention. This semiconductor device is different from the semiconductor device shown in FIG. 1 in that an antistatic protective film 91 made of an insulating material such as a polyimide resin or an epoxy resin is provided on the lower surface of a protective film 8 including wiring lines 10 of a semiconductor construct 2.

Therefore, in this case, the lower surface of the antistatic protective film 91 of the semiconductor construct 2 is adhesively bonded to the center of the upper surface of a lower insulating film 1 via an adhesive layer 3. A lower wiring line 21 is connected to a connection pad portion 10a of a wiring line 10 of the semiconductor construct 2 via an opening 13 of the lower insulating film 1, the adhesive layer 3 and the antistatic protective film 91.

In the meantime, the opening 13 is not formed in the antistatic protective film 91 before the semiconductor construct 2 is installed on the lower insulating film 1. Then, the antistatic protective film 91 having no opening 13 protects an integrated circuit formed under a silicon substrate 4 against static electricity from the point where the antistatic protective film 91 is formed under the silicon substrate 4 in a wafer state to the point where the semiconductor construct 2 is installed on the lower insulating film 1.

Sixth Embodiment

Figure 30:
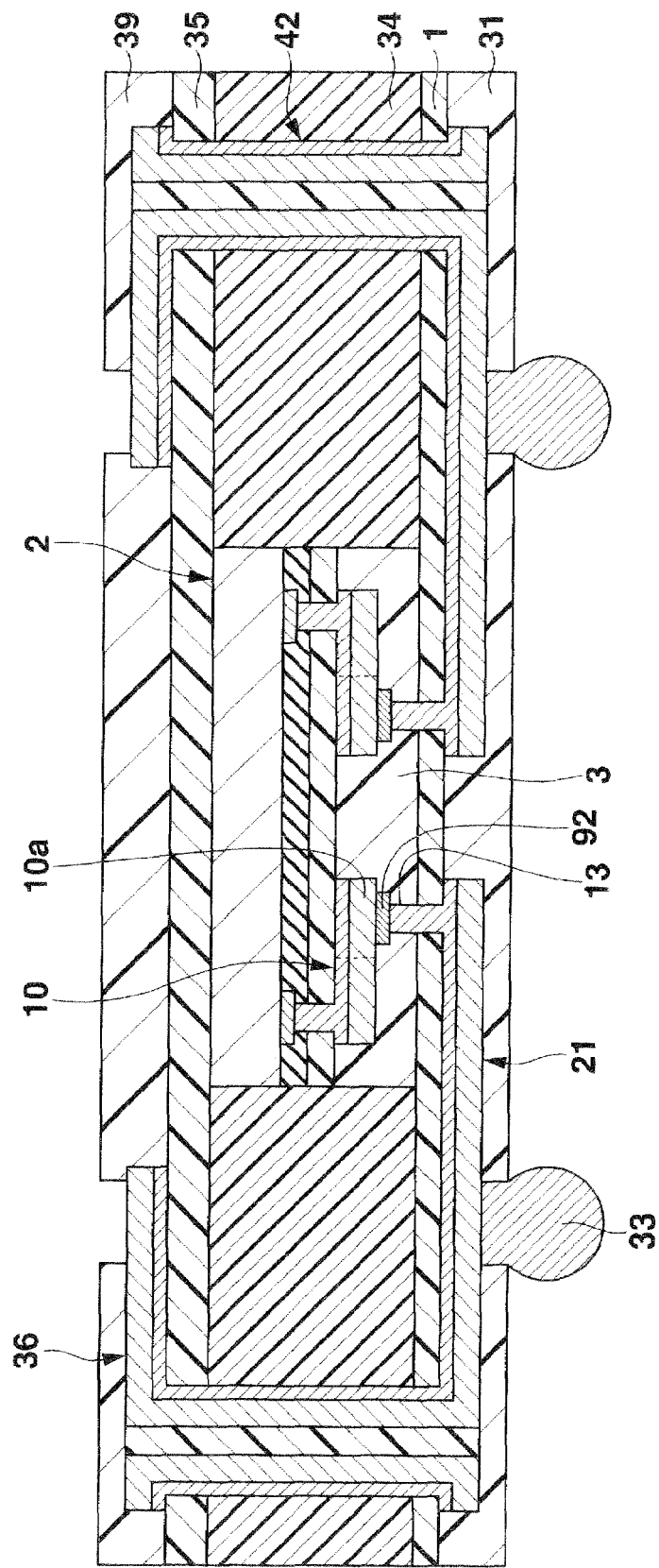
FIG. 30 is a sectional view of a semiconductor device as a sixth embodiment of this invention.

FIG. 30 shows a sectional view of a semiconductor device as a sixth embodiment of this invention. This semiconductor device is different from the semiconductor device shown in FIG. 1 in that a protective metal layer 92 made of electrolytic copper plating is provided on the lower surface of a connection pad portion 10a of a wiring line 10 of a semiconductor construct 2. In this case, the protective metal layer 92 protects the connection pad portion 10a of the wiring line 10 when a laser beam is applied. That is, the wiring line 10 is formed with a thickness of 5 to 10 μm, and the protective metal layer 92 is formed with a thickness of several μm on the connection pad portion 10a of the wiring line 10 alone in such a manner as to allow for the amount of etching by the laser beam, such that the thickness of the semiconductor construct 2 can be smaller.

Seventh Embodiment

Figure 31:
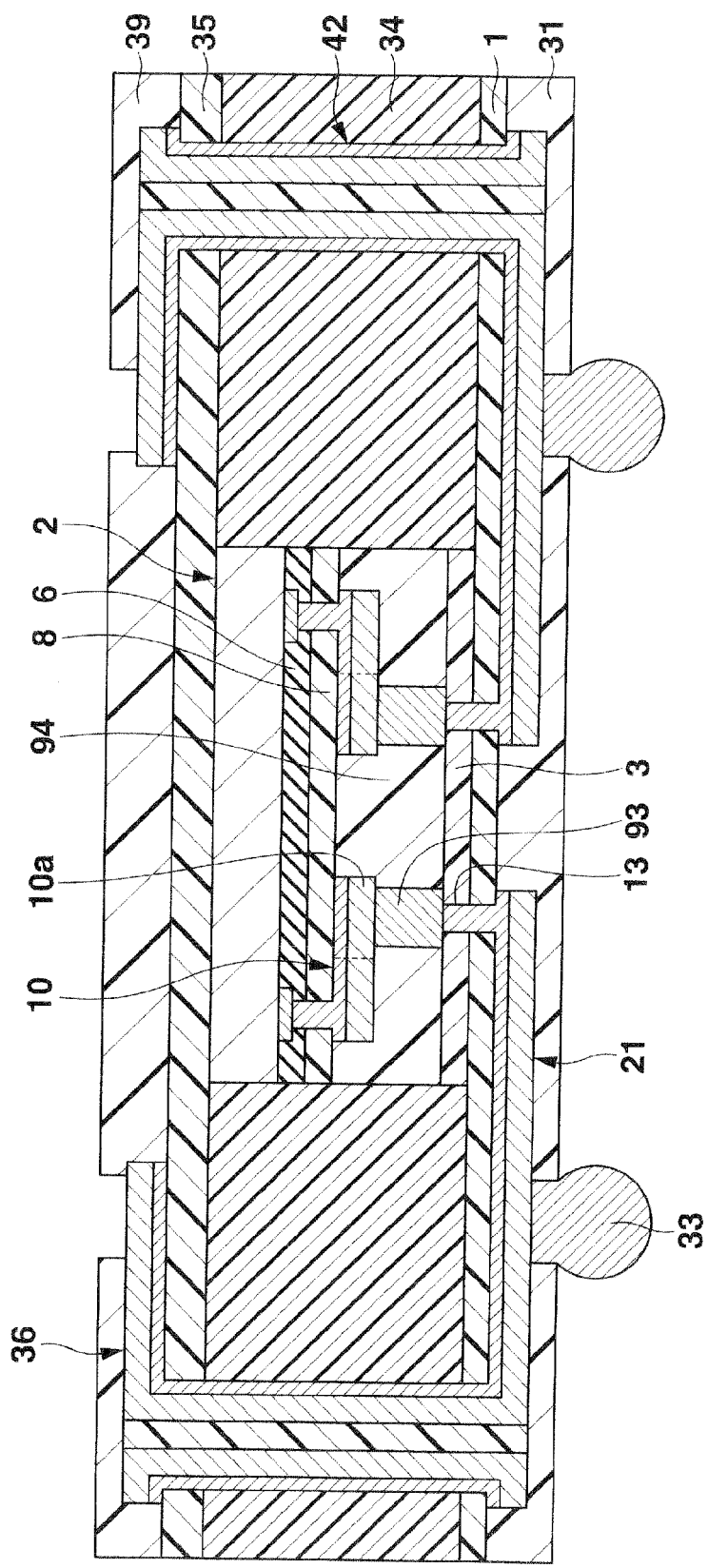
FIG. 31 is a sectional view of a semiconductor device as a seventh embodiment of this invention.

FIG. 31 shows a sectional view of a semiconductor device as a seventh embodiment of this invention. This semiconductor device is different from the semiconductor device shown in FIG. 1 in that a columnar electrode (external connection electrode) 93 made by electrolytic copper plating is provided at the center of the lower surface of a connection pad portion 10a of a wiring line 10 of a semiconductor construct 2, and in that a sealing film 94 made of, for example, an epoxy resin is provided on the lower surface of a protective film 8 including the wiring line 10 so that the lower surface of this sealing film 94 is flush with the lower surface of the columnar electrode 93. In this case, the lower surface of the sealing film 94 including the columnar electrode 93 is adhesively bonded to the center of the upper surface of a lower insulating film 1 via an adhesive layer 3. A lower wiring line 21 is connected to the columnar electrode 93 of the semiconductor construct 2 via an opening 13 of the lower insulating film 1 and the adhesive layer 3.

Eighth Embodiment

Figure 32:
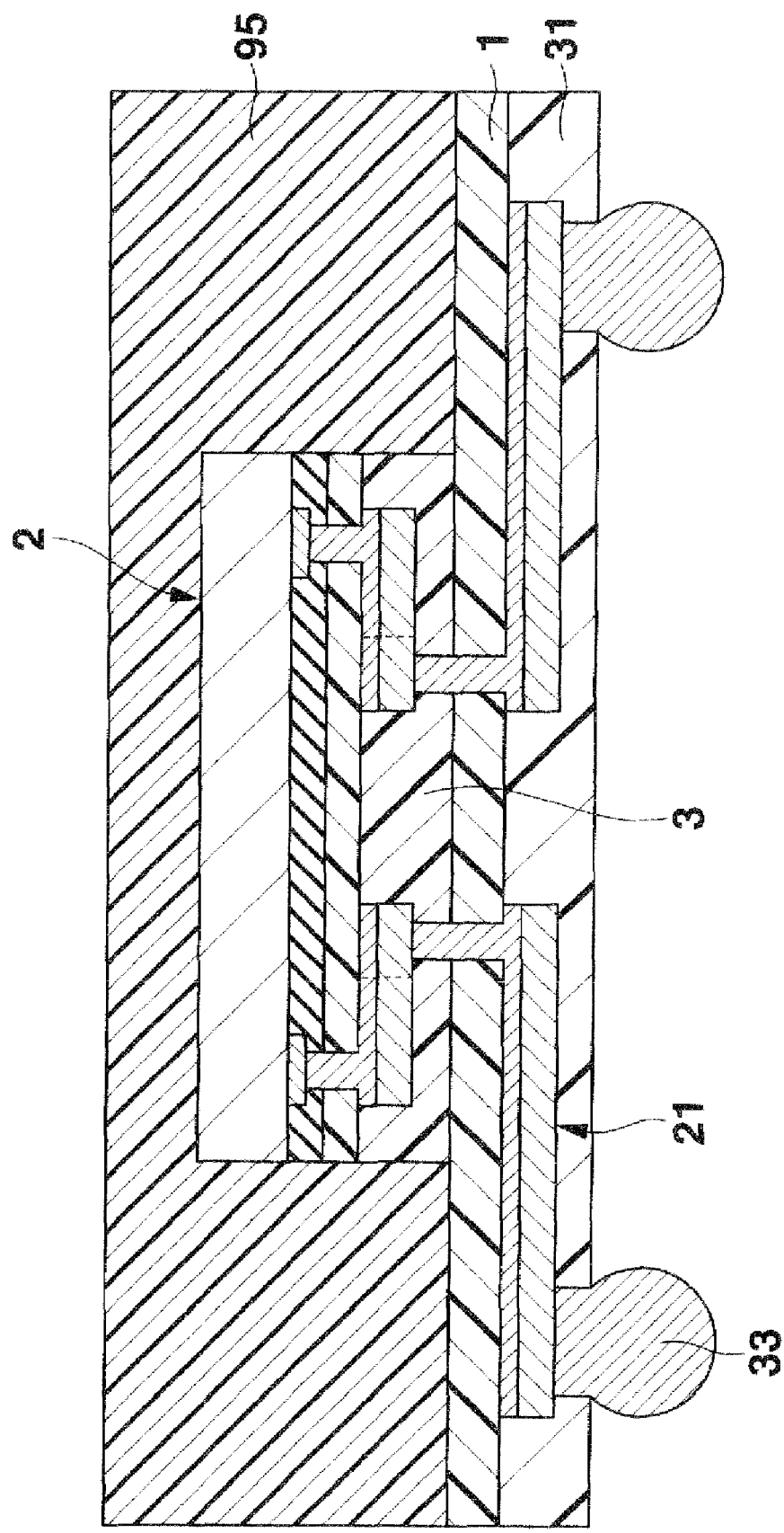
FIG. 32 is a sectional view of a semiconductor device as an eighth embodiment of this invention.

FIG. 32 shows a sectional view of a semiconductor device as an eighth embodiment of this invention. This semiconductor device is different from the semiconductor device shown in FIG. 1 in that a sealing film (insulating layer) 95 made of, for example, an epoxy resin is only provided on the upper surfaces of a semiconductor construct 2 and a lower insulating film 1. In this case, the sealing film 95 is formed by a molding method such as a transfer molding method.

In addition, the opening formed in the mask metal layer has a circular planar shape in each of the embodiments described above. However, the present invention is not limited to this. The planar shape of the opening can be any shape, such as a polygonal shape. Moreover, in the case described above, the solid mask metal layer having the opening is used when a laser beam is applied to the lower insulating film to form an opening therein. However, wiring lines and pad portions may be formed in the mask metal layer by patterning the mask metal layer before the laser beam is applied to the lower insulating film. Still further, the wiring line 10 connected to the connection pad 5 is formed in the semiconductor construct 2. However, the present invention is also applicable to a semiconductor construct which has no part for drawing the wiring lines but which only has external connection electrodes formed therein. Various other modifications can be made without departing from the spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   providing a semiconductor construct having a semiconductor substrate in which an external connection electrode is formed on one surface thereof;
   providing an insulating film covering a lower surface of the external connection electrode of the semiconductor construct, and a mask metal layer in which an opening having a planar size smaller than a planar size of the external connection electrode is formed to correspond to the external connection electrode, the mask metal layer being provided directly under the insulating film;
   using the mask metal layer as a mask to apply a laser beam to the insulating film via the opening, and thereby forming, in the insulating film, a connection opening reaching the external connection electrode; and
   forming a wiring line on the insulating film so that the wiring line is connected to the external connection electrode of the semiconductor construct via the connection opening of the insulating film and further to electrically connect an external solder ball.

2. The semiconductor device manufacturing method according to claim 1, wherein providing the insulating film covering the lower surface of the external connection electrode of the semiconductor construct includes forming a lower insulating film greater in planar size than a region in a plane of the planar size corresponding to the semiconductor construct, and forming the connection opening in the lower insulating film.

3. The semiconductor device manufacturing method according to claim 2, wherein forming the mask metal layer in which the opening is formed includes preparing a base plate, forming, on the base plate, the mask metal layer having the opening, and fixedly connecting the semiconductor construct onto the lower insulating film.

4. The semiconductor device manufacturing method according to claim 3, wherein forming the connection opening in the lower insulating film includes removing the base plate to expose the mask metal layer having the opening.

5. The semiconductor device manufacturing method according to claim 2, wherein forming the mask metal layer in which the opening is formed includes preparing a laminated sheet in which a solid mask metal layer is mounted on an entire surface of the lower insulating film, patterning the solid mask metal layer to form the opening, and mounting the semiconductor construct on the lower insulating film.

6. The semiconductor device manufacturing method according to claim 2, wherein providing the semiconductor construct includes forming an adhesive layer covering the lower surface of the external connection electrode.

7. The semiconductor device manufacturing method according to claim 6, further comprising mounting the semiconductor construct having the adhesive layer onto the lower insulating film, before forming the mask metal layer in which the opening is formed.

8. The semiconductor device manufacturing method according to claim 7, wherein forming the connection opening reaching the external connection electrode includes using the mask metal layer as a mask to apply a laser beam via the opening, and thereby forming the connection opening in the lower insulating film and the adhesive layer.

9. The semiconductor device manufacturing method according to claim 8, wherein forming the wiring line includes removing the mask metal layer having the opening to form the wiring line on a lower surface of the lower insulating film.

10. The semiconductor device manufacturing method according to claim 8, wherein forming the wiring line includes forming the wiring line on a lower surface of the mask metal layer, and removing the mask metal layer in a region other than the wiring line.

* * * * *